(12) United States Patent
Scarlete et al.

(10) Patent No.: US 9,944,532 B2
(45) Date of Patent: Apr. 17, 2018

(54) SOLID SOURCE AND METHOD FOR THE SYNTHESIS OF SILICON-CONTAINING PRECURSORS FOR CHEMICAL VAPOR DEPOSITION

(71) Applicants: SOCPRA Science et Genie S.E.C., Sherbrooke (CA); UNIVERSITÉ DE BISHOP, Sherbrooke (CA)

(72) Inventors: Mihai Scarlete, Montreal (CA); Cetin Aktik, Sherbrooke (CA)

(73) Assignee: SOCPRA Science et Génie S.E.C., Sherbrooke (CA)

( * ) Notice: Subject to any disclaimer, the term of this patent is extended or adjusted under 35 U.S.C. 154(b) by 119 days.

(21) Appl. No.: 15/030,003

(22) PCT Filed: Oct. 22, 2014

(86) PCT No.: PCT/CA2014/000766
§ 371 (c)(1),
(2) Date: Apr. 15, 2016

(87) PCT Pub. No.: WO2015/058285
PCT Pub. Date: Apr. 30, 2015

(65) Prior Publication Data
US 2016/0347620 A1    Dec. 1, 2016

Related U.S. Application Data

(60) Provisional application No. 61/894,280, filed on Oct. 22, 2013.

(51) Int. Cl.
| | | |
|---|---|---|
| *C23C 16/00* | (2006.01) |
| *C01B 33/04* | (2006.01) |
| *C23C 16/22* | (2006.01) |
| *C23C 16/448* | (2006.01) |
| *C09D 5/24* | (2006.01) |
| *C09K 5/14* | (2006.01) |

(52) U.S. Cl.
CPC ............ *C01B 33/043* (2013.01); *C01B 33/04* (2013.01); *C09D 5/24* (2013.01); *C09K 5/14* (2013.01); *C23C 16/22* (2013.01); *C23C 16/448* (2013.01)

(58) Field of Classification Search
CPC ................. C04B 41/89; C23C 16/22
USPC ............................... 427/248.1, 562
See application file for complete search history.

(56) References Cited

FOREIGN PATENT DOCUMENTS

EP    1364929 A1 * 10/2001 ............. C04B 35/80

OTHER PUBLICATIONS

Zhou et al., "Beta-SiC nanorods synthesized by hot filament chemical vapor deposition", Applied Physics Letter, vol. 74, No. 26, Jun. 28, 1999, pp. 3942-3944. (Year: 1999).*

* cited by examiner

*Primary Examiner* — Khanh T Nguyen
(74) *Attorney, Agent, or Firm* — Benoit & Cote, Inc.; C. Marc Benoit

(57) ABSTRACT

The present document described a solid source and a method for synthesis of silicon-containing precursors for chemical vapor deposition. The solid source comprises a solid polysilane; an energy coupling agent distributed in the solid polysilane; and hydrogen, mixed with the solid polysilane and the energy coupling agent distributed in the solid polysilane, in a necessary amount to satisfy a hydrogen deficiency during a hydrogenolysis reaction.

21 Claims, No Drawings

SOLID SOURCE AND METHOD FOR THE SYNTHESIS OF SILICON-CONTAINING PRECURSORS FOR CHEMICAL VAPOR DEPOSITION

CROSS-REFERENCE TO RELATED APPLICATIONS

This application claims priority of U.S. provisional patent application No. 61/894,280, filed on Oct. 22, 2013.

BACKGROUND (a) Field

The subject matter disclosed generally relates to solid sources and methods for the synthesis of gaseous precursors used in the Chemical Vapor Deposition (i.e., CVD). More particularly, the subject matter disclosed relates to solid sources for the synthesis of gaseous silicon-containing precursors used in the CVD of silicon-based ceramic thin films used for, without limitation, protective coatings, refractory ceramics, and thin films for electronic and semiconductor devices.

(b) Related Prior Art

Chemical vapor deposition (i.e., or CVD) is a chemical process used to produce high-purity and/or high-performance solid materials. The process is often used in the semiconductor industry to produce thin films. In typical CVD processes, the wafer (i.e., the substrate) is exposed to one or more volatile precursors, which react and/or decompose on the substrate surface to produce the desired deposit. Frequently, volatile by-products are also produced, which are removed by gas flow through a reaction chamber.

Microfabrication processes widely use CVD to deposit materials in various forms, which include, without limitation, monocrystalline, polycrystalline, amorphous, epitaxial and the like. These materials include, without limitation, silicon, carbon fiber, carbon nanofibers, filaments, carbon nanotubes, $SiO_2$, silicon-germanium, tungsten, silicon carbide, silicon nitride, silicon oxynitride, titanium nitride, various high-k dielectrics and the like.

For example, U.S. Pat. No. 7,396,563 to Scarlete et al. discloses a semiconductor thin film of amorphous silicon carbide obtained through vapor deposition following desublimation of pyrolysis products of polymeric precursors in inert or active atmosphere. This Polymer-Assisted Chemical Vapor Deposition (PA-CVD) allowed one or multi-layers compositions, microstructures and thicknesses to be deposited on a wide variety of substrates.

European Patent no. EP 2,122007 to Awad et al. discloses a method for forming a film on a substrate. The method comprises the steps of heating a solid organosilane source in a heating chamber to form a gaseous precursor, transferring the gaseous precursor to a deposition chamber, and reacting the gaseous precursor using an energy source to form the film on the substrate. The film comprises Si and C, and optionally the film comprises other elements such as N, O, F, B, P, or any suitable combination. However, according to this method, CVD of the film changes. However, the a) higher average temperature and b) high thermal gradient in the section of the solid source, induced by the conductive heating of the solid organosilane source used in this method, both required for the formation of the gaseous precursors (inhomogeneous distribution in the section of the solid source resulting in a much higher temperature on the outer shell that in the core of the solid source) produces a high amount of low molecular weight, volatile carbosilane species with negative impact on the yield of the transformation of the solid source into the desired gaseous precursor—dimethylsilane.

US Patent Publication no. 2010/0051096 to Kim, D. S. et al. discloses a silicon solar cell which comprises an antireflective coating, which coating comprises amorphous silicon carbonitride, and where the amount of carbon in the silicon carbonitride is from 5 to 25 atomic %. The gaseous mono-silicon organosilanes are obtained from pyrolysis of a solid organosilane source, such as polydimethylsilane. This document shows that C-containing silicon-based ceramic films can be used for the fabrication of solar cells.

US Patent Publication no. 2010/0186811 to Kim, D. S. et al. discloses an antireflective coating for silicon-based solar cells which comprises amorphous silicon carbonitride, a solar cell comprising the antireflective coating, and a method of preparing the antireflective coating from one or more gaseous mono-silicon organosilane obtained from pyrolysis of a solid organosilane source, listing polydimethylsilane, polycarbomethylsilane, triphenylsilane, or nonamethyltrisilazane for example. This document shows that C-containing silicon-based ceramic films can be used for the fabrication of solar cells.

National Institute of Standards and Technology (NIST) in "*Layered graphene sheets could solve hydrogen storage issue*" (2010, Mar. 19), and J. Burress, J. Simmons, J. Ford and T. Yildirim in "*Gas adsorption properties of graphene-oxide-frameworks and nanoporous benzene-boronic acid polymers*" (American Physical Society Meeting, Mar. 18, 20101, Portland, Oreg.) reported that grapheme-oxide frameworks (GOF) can accumulate hydrogen in large quantities. The description of hydrogen-supports like the one described here does not come with the possibility of eliminating the hydrogen-deficit of PDMS with respect to improved stoichiometrical (i.e., full) decomposition in DMS. Rafiee J. et al. from Renssselar Polytechnic Institute have reported a novel form of engineered graphene that exhibits hydrogen storing capacity far exceeding any other known material. No connection is mentioned with respect to a possible usage of this material for obtaining improved decomposition of PDMS into DMS.

Yang Yang and Richard Kaner, from the California Nano-Systems Institute (CNSI), have reported a technology for making graphene sheets in big quantities and at a low price. No connection is mentioned in this method with respect to a possible usage of this material for obtaining improved decomposition of PDMS into DMS.

Morgan, D. et al. presented in their CRS' Report for Congress 95-540 SPR the capability of hydrogen storage and controlled release via glass microspheres. These are small, hollow, glass micro-balloons which have diameters that vary from about 25 microns to 500 microns (i.e., $\frac{1}{1000}$ inch to $\frac{20}{1000}$ inch), and which have wall thicknesses that are about 1 micron. They can be used in large beds to store hydrogen at high pressures. The microspheres are filled with hydrogen gas at temperatures of 200 to 400 degrees Centigrade. The high temperature makes the glass walls permeable, and the gas fills the spheres. Once the glass is cooled to room temperature, the hydrogen is trapped inside the spheres. This document allows exact control of the temperature of H-delivery in the system. The composition of the glass could be arranged such that at the Tg, a high amount of H is abruptly delivered in the system. However, this document allows for efficiency only if the H-storage property of graphite is lower than the practical required level for the stoichiometric decomposition of PDMS into DMS. No connection is mentioned in this method with respect to a possible usage of this material for obtaining improved decomposition of PDMS into DMS.

The generation of gaseous precursors from the source is currently based on conductive and radiative heating. Processing of a 250 g charge of solid source requires a continuous 5-15 kW supply from an electrical resistor over 4-8 hours. There is therefore a need for an improved solution for the transfer of the energy required by this reaction.

Bulk graphite is commonly used as susceptor for radio frequency heating (i.e., RF heating). For example, Berkman et al. discloses in U.S. Pat. No. 3,980,854 a susceptor for heating a plurality of semiconductor wafers, by RF induction, comprising a hollow truncated pyramid of conventional graphite.

In another environment, Kaeppeler et al. discloses in U.S. Pat. No. 7,048,802 the use of graphite foam for depositing crystalline layers on crystalline substrates by means of reaction gases fed to a heated process chamber. This process chamber is formed by the cavity of an especially multi-part graphite tube arranged in a reactor housing that especially comprises quartz walls. This reactor housing, in the area of the process chamber, is enclosed by a high-frequency coil and the space between the reactor housing and the graphite tube is filled with a graphite foam sleeve.

Additionally, synthesis of graphite flakes which includes grapheme layers is disclosed in U.S. Pat. No. 7,754,184. In this patent, a process for the production of nano-structures is presented, involving the steps of providing a graphite flake comprising graphene layers, intercalating the graphite flake to form a graphite intercalation compound exhibiting Stage I, II or III intercalation, and exfoliating the graphite intercalation compound under conditions such that a plurality of individual graphene layers are separated from the graphite intercalation compound.

Silicon carbide can also be used as susceptor material. Koag et al. discloses in U.S. Pat. No. 5,119,540 a method, and associated apparatus and product, for forming extremely pure epitaxial layers of silicon carbide by reducing the carrier concentration of residual nitrogen in silicon carbide formed by chemical vapor deposition processes. The method comprises placing a substrate upon which an epitaxial layer of silicon carbide will form upon a susceptor. U.S. Pat. No. 5,119,540 takes advantage of the fact that, although the breaking of Si—Si bonds which is the onset for Kumada rearrangement starts as low as 200° C., the quantitative production of this rearrangement which is carbosilane is observed only around 400° C.

There is therefore a need for improved solid sources and methods for the synthesis of silicon-containing precursors for chemical vapor deposition and/or for the synthesis of gaseous precursors used in the chemical vapor deposition of silicon-based ceramic thin films used for, without limitation, protective coatings, refractory ceramics, and thin films for electronic and semiconductor devices.

SUMMARY

According to an embodiment, there is provided a solid source for synthesis of silicon-containing precursors for chemical vapor deposition, the solid source comprising: a solid polysilane; an energy coupling agent distributed in the solid polysilane; and hydrogen, mixed with the solid polysilane and the energy coupling agent distributed in the solid polysilane, in a necessary amount to satisfy a hydrogen deficiency during a hydrogenolysis reaction.

According to another embodiment, the solid source further comprises a hydrogen-carrier mixed with the solid polysilane and the energy coupling agent distributed in the solid polysilane, the hydrogen-carrier comprising the hydrogen in the necessary amount to satisfy the hydrogen deficiency during the hydrogenolysis reaction.

According to another embodiment, the solid source further comprises a hydrogenation catalyst mixed with at least one of the solid polysilane, the energy coupling agent and the hydrogen-carrier.

According to yet another embodiment, at least one of the hydrogen-carrier and the energy coupling agent comprises at least one of: a graphite material, a fullerene material, a graphene material, an activated carbon material, a carbon-metal complex material, metal complex material, ceramic material, a zeolite material, a glass microsphere material, a glass capillary or filament material, a silicon carbide material, a silicon-metal complex material, an electrically conductive material that can be heated by at least one of: induction, radio-frequency, absorption radiation and microwave radiation and a nanotube material.

According to another embodiment, the hydrogenation catalyst comprises at least one of: cobalt (Co), nickel (Ni), platinum (Pt), palladium (Pd), rhodium (Rh), ruthenium (Ru), titanium (Ti), zirconium (Zr), hafnium (Hf), an oxide of a Ziegler-Nata catalyst and a metal-free catalyst.

According to a further embodiment, the hydrogen contained in the hydrogen-carrier is from about 0.01 to about 10 times a stoichiometric amount necessary to satisfy the hydrogenolysis reaction.

According to yet another embodiment, the solid polysilane and the hydrogen are mixed in a stoichiometric ratio solid polysilane/hydrogen of about 0.1 to about 10.

According to another embodiment, the hydrogen-carrier is in one of: a gel state and a solid state.

According to another embodiment, the solid source further comprises at least one of: an electrically conductive material and a thermally conductive material mixed with the solid polysilane.

According to a further embodiment, the at least one of: the electrically conductive material and the thermally conductive material comprises at least one of: a powder capable of RF coupling, flakes capable of RF coupling, granules capable of RF coupling, chunks capable of RF coupling, a powder capable of IR coupling, flakes capable of IR coupling, granules capable of IR coupling, chunks capable of IR coupling, a powder capable of UV coupling, flakes capable of UV coupling, granules capable of UV coupling and chunks capable of UV coupling.

According to yet another embodiment, the weight of the solid source is between about 0.1 g to about 10 kg.

According to another embodiment, the solid polysilane comprises at least one of: a polymethylsilane, a polydimethylsilane, a polyvinylsilane, a polyhydridosilane and a polyphenylsilane.

According to a further embodiment, there is provided a method for synthesis of a solid source for the production of silicon-containing precursors for vapor chemical deposition, the method comprising: mixing a solid polysilane and an energy coupling agent distributed in the solid polysilane with a necessary amount of hydrogen to satisfy a hydrogen deficiency during a hydrogenolysis reaction.

According to yet another embodiment, mixing the solid polysilane and the energy coupling agent distributed in the solid polysilane with a necessary amount of hydrogen to satisfy the hydrogen deficiency during the hydrogenolysis reaction comprises mixing the solid polysilane and the energy coupling agent distributed in the solid polysilane with a hydrogen-carrier comprising the necessary amount of hydrogen to satisfy the hydrogen deficiency during the hydrogenolysis reaction.

According to another embodiment, the method further comprises mixing a hydrogenation catalyst with at least one of: the solid polysilane, the energy coupling agent and the hydrogen-carrier, the hydrogenation catalyst comprising at least one of: cobalt (Co), nickel (Ni), platinum (Pt), palladium (Pd), rhodium (Rh), ruthenium (Ru), titanium (Ti), zirconium (Zr), hafnium (Hf), an oxide of a Ziegler-Nata catalyst and a metal-free catalyst.

According to a further embodiment, the mixing the solid polysilane and the energy coupling agent distributed in the solid polysilane with the hydrogen-carrier comprises one of: pressing and compacting the solid polysilane and the energy coupling agent distributed in the solid polysilane with the hydrogen-carrier.

According to yet another embodiment, the one of: pressing and compacting occurs at a pressure of between about $10^{-5}$ torr and 100 atm.

According to another embodiment, the hydrogenolysis reaction has a reaction temperature of between about 100° C. and about 400° C.

According to a further embodiment, the method further comprises controlling the reaction temperature of the hydrogenolysis reaction for sequentially satisfy the hydrogen deficiency during the hydrogenolysis reaction.

According to yet another embodiment, the method further comprises mixing at least one of: an electrically conductive material and a thermally conductive material with at least one of: the solid polysilane, the energy coupling agent and the hydrogen.

According to another embodiment, the method further comprises mixing the electrically conductive material and the thermally conductive material with the at least one of: the solid polysilane, the energy coupling agent and the hydrogen.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

DETAILED DESCRIPTION

In embodiments there are disclosed solid sources and methods for the synthesis of silicon-containing precursors for chemical vapor deposition.

According to an embodiment, there is provided a solid source for synthesis of silicon-containing precursors for chemical vapor deposition. The solid source includes a solid polysilane, an energy coupling agent distributed in the solid polysilane and hydrogen, mixed with the solid polysilane and the energy coupling agent distributed in the solid polysilane, in a necessary amount to satisfy a hydrogen deficiency during a hydrogenolysis reaction.

According to another embodiment, the solid source may further includes a hydrogen-carrier mixed with the solid polysilane and the energy coupling agent distributed in the solid polysilane. The hydrogen-carrier and/or the energy coupling agent (which may be a susceptor) are for liberating the necessary amount of hydrogen to satisfy the hydrogen deficiency during the hydrogenation reaction. Thus, the solid polysilane and the energy coupling agent of the solid source may be compressed and/or mixed with the hydrogen-carrier and/or with hydrogen molecules found in void spaces provided within the solid polysilane and/or the energy coupling agent in order to satisfy the hydrogen deficiency during the hydrogenolysis reaction.

According to another embodiment, the energy coupling agent and/or the hydrogen-carrier may include, without limitation, a graphite material, a fullerene material, a graphene material, an activated carbon material, a carbon-metal complex material, a zeolite material, a glass microsphere material, a glass capillary or filament material, a silicon carbide material, a silicon-metal complex material, an electrically conductive material that can be heated by induction, radio-frequency, ultraviolet or infrared radiation and/or microwave radiation and/or a nanotube material, and the like.

According to another embodiment, the hydrogen-carrier (or the energy coupling agent) may further include, without limitation, metal complexes and/or ceramic materials, and the like.

According to another embodiment, the solid source may further include a hydrogenation catalyst mixed with the solid polysilane and/or the hydrogen-carrier (or hydrogen) and/or the energy coupling agent.

According to another embodiment, the hydrogenation catalyst may include, without limitation, cobalt (Co), nickel (Ni), platinum (Pt), palladium (Pd), rhodium (Rh), ruthenium (Ru), titanium (Ti), zirconium (Zr), hafnium (Hf), an oxide of a Ziegler-Nata catalyst and/or a metal-free catalyst, and the like.

According to another embodiment, the hydrogenation catalyst may be a complex of any of the above-noted metals which may include, without limitation, metallocene complexes and the like.

According to another embodiment, the hydrogenation catalyst can be designed for hydro-amination, hydro-phosphorilation, and/or hydro-boration of the solid polysilane.

According to another embodiment, the hydrogen catalyst may further include, without limitation, any common catalysts used in general organic synthesis, particular design for hydrogenation reactions in terms of substrate, granulation, activation, and the like.

More particularly and according to another embodiment, there is provided a solid source for the synthesis of a large series of organosilanes. More particularly, there is provided a solid source for the synthesis of a large series of organosilanes with the formula $R_{2n+2-x}Si_nH_x$, where $R=\!\!=\!\!-C_nH_{2n+1}$, n=1 . . . 3 and x=2 . . . 6.

According to a further embodiment, the solid source may include an electrically and/or thermally conductive material and/or a thermal conductive material.

According to another embodiment, the electrically and/or thermally conductive material may be, without limitation, a powder, flakes, granules, chunks, and the like capable of RF coupling or any other energy coupling using induction, radio-frequency, ultraviolet or infrared radiation and/or microwave radiation and the like.

According to another embodiment, the thermally conductive material may be, without limitation, powder, flakes, granules, chunks and the like.

It is to be noted that using the solid source as described, the efficiency of silicon-containing precursor formation can be increased from a usual 30% to values higher than 50% of the theoretical yield.

According to another embodiment, the solid source described above, may be best suited for an efficient synthesis of methylsilanes with the formulae $(CH_3)_{4-x}SiH_x$ which may be used as precursors for, without limitation, the industrial production of a large variety of silicon-based ceramic films, including, but not limited to, silicon carbide, silicon carbonitride, silicon nitride, silicon oxicarbide, silicon oxinitride, silicon oxicarbonitride. These films may be widely used as passive and active films in the semiconductor industry. The films may also be utilized as protective and refractive coatings in industries such as the automotive, the aeronautical, and the weapon industries.

The amount of hydrogen contained in the hydrogen-carrier may be calculated to ensure from about 1% to about 10 times the stoichiometric amount necessary to synthesize the hydrogenated monomer, which may be equivalent of 2 hydrogen atoms for each broken Si—Si bond.

According to another embodiment, the solid polysilane may be, without limitation, polymethylsilane, polydimethylsilane, polyvinylsilane, polyhydridosilane, polyphenylsilane, any copolymer as defined above, which includes poly(methyl)dimethylsilane, and the like.

According to another embodiment, R ($R_{2n+2-x}Si_nH_x$, where R=—$C_nH_{2n+1}$) may be an organic substituent.

According to another embodiment, the organic substituent R may be, without limitation, a nonsaturated group containing any of the elements carbon (C), hydrogen (H), silicium (Si), nitrogen (N), bore (B), phosphor (P), aluminum (Al), antimony (Sb), arsenic (As), gallium (Ga), indium (In), titanium (Ti), zirconium (Zr) and/or sulfur (S), and the like.

According to another embodiment, the hydrogen-carrier may be in, without limitation, an amorphous form, a vitrified form, a crystalline form, any suitable combination and the like.

According to another embodiment, the hydrogen-carrier may be any electrically conductive material that can be heated via induction, illumination or radio-frequency.

According to another embodiment, the hydrogen-carrier may be any material that can be heated via absorption of any radiation.

According to another embodiment, the hydrogen-carrier may include a material where the hydrogen-storage capacity of the material may be enhanced via metal doping, or induced polarization via electric or magnetic fields.

According to another embodiment, the hydrogenation catalyst may be an oxide (oxide of cobalt (Co), nickel (Ni), platinum (Pt), palladium (Pd), rhodium (Rh), ruthenium (Ru), titanium (Ti), zirconium (Zr), hafnium (Hf), an oxide of a Ziegler-Nata catalyst and/or a metal-free catalyst) such as, without limitation, $Al_2O_3$, $TiO_2$, any suitable combination and the like.

According to another embodiment, the solid polysilane of the solid source may be a polydimethylsilane.

According to another embodiment, the solid polysilane of the solid source may be a polymethylsilane.

According to another embodiment, the solid polysilane of the solid source may be a copolymer methyl-dimethylsilane.

According to another embodiment, the nickel (Ni)-hydrogenation catalyst may be in a form such as, without limitation, a Raney form, a Urushibara form and the like.

According to another embodiment, the metal hydrogenation catalyst may be provided on a support.

According to another embodiment, there is provided a method for synthesis of the solid source for the production of silicon-containing precursors for vapor chemical deposition. The method includes mixing the solid polysilane and the energy coupling agent distributed in the solid polysilane with the necessary amount of hydrogen to satisfy the hydrogen deficiency during the hydrogenolysis reaction.

According to another embodiment, the solid source may be obtained by pressing the mixture of the solid polysilane (with the energy coupling agent distributed in the solid polysilane) with the hydrogen-carrier which is designed to liberate the necessary amount of hydrogen to satisfy the hydrogen deficiency required for the regeneration of the monomer (i.e., $R_{2n+2-x}Si_nH_x$) via the hydrogenolysis reaction. As described above, the hydrogen-carrier may be based on C-containing compounds which are known for their capacity for storing hydrogen in molecular or atomic form. As mentioned above, the C-containing compound may include, without limitation, graphite materials, fullerene materials, graphene materials, activated carbon materials, carbon-metal complex materials, zeolite materials, glass microsphere materials, glass capillary or filament materials, silicon carbide materials, silicon-metal complex materials, electrically conductive material that can be heated by induction, radio-frequency, absorption radiation and/or microwave radiation and/or nanotube materials, and the like.

According to another embodiment, the method may further include the step of mixing the hydrogenation catalyst which may include, without limitation, cobalt (Co), nickel (Ni), platinum (Pt), palladium (Pd), rhodium (Rh), ruthenium (Ru), titanium (Ti), zirconium (Zr), hafnium (Hf), an oxide of a Ziegler-Nata catalyst and/or a metal-free catalyst and/or any suitable combination, and the like, with the solid polysilane, the energy coupling agent and/or the hydrogen-carrier.

According to another embodiment, the step of mixing the solid polysilane (and the energy coupling distributed in the solid polysilane) with the hydrogen-carrier may include the step of mixing a mixture of solid polysilanes (and the energy coupling distributed in the solid polysilane) with the hydrogen-carrier for the production of precursors for CVD.

According to another embodiment, the method may include the step a) of providing a solid polymeric source which includes the polysilane, or a mixture which includes at least one polysilane specie. The method may further includes the step b) of providing the hydrogen-carrier. The hydrogenation reaction may be thermodynamically favored at low temperatures (the uncertainty on the value of free enthalpy of polydimethylsilane is still high at this time) but extrapolating the results of the equilibrium state in the systems disilane-hydrogen, trisilane-hydrogen and the corresponding methyl-substituted silanes, the temperature range of 100° C. to about 400° C. is adequate for advancing the transformation of the polydimethylsilane into dimethylsilane from the previously obtained yield of 30% to higher values (as shown in examples 1 to 8 below).

According to a further embodiment, the hydrogen-carrier may bring to the system, instead of hydrogen, the following compounds in adsorbed, absorbed, chemically and/or physically bound, or included state, without limitation, $NH_3$, $N_2H_4$, $PH_3$, $BH_3$, $B_2H_6$ and the like.

According to another embodiment, the method may further include the step c) of providing/mixing the hydrogenation catalyst mentioned above with the solid polysilane, energy coupling agent and/or the hydrogen-carrier (or hydrogen). According to another embodiment, the method may further include the step d) of providing/mixing an electrically and/or thermally conductive material with the solid polysilane, the energy coupling agent, the hydrogen-carrier and/or the hydrogenation catalyst.

According to another embodiment, the method may further include the step e) of providing/mixing a thermally conductive material with the solid polysilane, the energy coupling agent, the hydrogen-carrier and/or the hydrogenation catalyst.

According to another embodiment, the thermally conductive material may be mixed with the solid polysilane.

According to another embodiment, the method may further include the step f) of compacting, isostatically or unidirectional, the solid polysilane (provided in step a), the hydrogen-carrier (provided in step b), the hydrogenation catalyst (provided in step c), the electrically and/or thermally conductive material (provided in step d) and/or the thermally conductive material (provided in step e) in order to produce a self-sustainable block.

According to an embodiment, the mass of the obtained self-sustainable block may between about 0.1 g to about 10 kg.

According to another embodiment, the method may further include the step of mixing the solid polysilane and the hydrogen-carrier in a stoichiometric ratio solid polysilane/hydrogen of about 0.1 to about 10.

According to another embodiment, the method may further include the step of mixing the solid polysilane and the electrically and/or thermally conductive material in a stoichiometric ratio solid polysilane/hydrogen of about 0.1 to about 10.

According to another embodiment, the method may further include the step of providing the electrically and/or thermally conductive material in a hydrogen-enriched form. Hydrogen may be physically and/or chemically bound, molecular and/or atomic, in neutral and/or ionic form.

According to another embodiment, the method may further include the step of mixing the solid polysilane, the hydrogen-carrier and the hydrogenation catalyst, where the mass ratios between any two components is from about 0.1 to about 10.

According to another embodiment, the method may further include the step of heating the mixture (i.e., the solid polysilane with its distributed energy coupling agent mixed with hydrogen or hydrogen-carrier and the hydrogenation catalyst, the electrically and/or thermally conductive material) at a temperature higher than about 100° C. and lower than about 700° C. so that the breaking of the Si—Si bond of the polymer (i.e., the solid polysilane) is simultaneous or consecutive to the liberation of reactive hydrogen from the hydrogen-carrier. The method allows the reaction to occur below 400° C., to avoid formation of undesired byproducts. However, theory and reality may be different, especially when the weight of the solid source is from 0.5 g to 1 kg. Accordingly, the temperature of the reaction is such that it does not reduce drastically the formation of dimethylsilane. This step may provide that the reaction of the polymeric fragments of the solid polysilane with hydrogen is carried under a hydrogen-rich atmosphere in the presence of the hydrogenation catalyst.

According to another embodiment, the method described above may further include a step of controlling the temperature of the hydrogenolysis reaction for sequentially satisfying the hydrogen deficiency during the hydrogenolysis reaction. Indeed, instead of decomposing totality of the solid source under the hydrogenolysis reaction, the solid source may be decomposed partially during different stages of the hydrogenolysis reaction, by controlling the temperature of reaction. This sequential reaction is possible due to the fact that the solid source, which is decomposed under hydrogenolysis reaction, is decomposed at a lower temperature (i.e., from about 100° C. to about 400° C.), and to the rapidity of the induction heating of the solid source (i.e., which is possible because of the mixture of solid polysilane and the hydrogen-carrier). Therefore, the synthesis of gaseous silicon-based precursors may be performed by the reaction only when there is a need, by controlling the temperature of the reaction. Some advantages of the sequential synthesis is that the stockade may be performed under a solid form, and not under the gaseous form, which is easier to stock.

The method may render both kinetic and thermodynamic conditions favorable for the reaction between the polymeric fragments of the solid polysilane resulted from the scission of the Si—Si bonds with hydrogen, generating the hydrogenated monomer (i.e., if the polymer used is polydimethylsilane, dimethylsilane is generated efficiently). Under these conditions, the efficiency is largely favored over the alternative insertion of the $R_3Si$— fragments in the C—H bonds (i.e., reaction known as the Kumada rearrangement) that leads to the formation of carbosilane species.

One of the differences between the solid sources and methods as described above and the solid sources and methods of the prior art may result in the in situ addition of graphite (i.e., energy coupling agent), in intimate mixture with or distributed within the solid source. There are at least two advantages related to the methods as described above: a) the graphite susceptor (i.e., energy coupling agent or RF susceptor) mixed with the solid polysilane source allows in situ use of inductive heating, therefore more efficient, more homogeneous, faster rate and better control of the heat input required for the reaction producing the gaseous precursors; b) graphite is one of the most promising supports for hydrogen storage, and hydrogen deficiency of the source itself drastically limits the extent of the hydrogenolysis reaction required to produce the CVD-precursors (i.e., SiXtron: 220 L vs. the 250 L required by industry standards—e.g., SunTech Corp.).

The methods as described above for the generation of the CVD-precursors aims at total compatibility with the procedure used today by the main manufacturers of solar cells. According to the methods described above, it is possible to deliver faster, more precursors for the films, and in a more energetically-efficient way.

According to another embodiment, graphene (i.e., thin layers of graphite) may be some of the best candidates for the method as described above, due to their capacity of storage and cheap cost of production.

According to another embodiment, if SiC can be used as a susceptor, then the methods as described above may allow synthesizing SiC from polydimethylsilane (PDMS), in the same way as graphite. It would be expected in this case that the C-level of the film in the SiC-susceptor case would be lower.

According to another embodiment, the mixture of the solid polysilane, the energy coupling agent and the hydrogen-carrier (hydrogen) may be heated. The efficiency of this solid source is the result of at least improved thermodynamic conditions.

According to another embodiment, the solid polysilane, the energy coupling agent, the hydrogen-carrier (or hydrogen) and the hydrogenation catalyst, when mixed together, are heated. The efficiency of this solid source is the result of at least the improvement of both thermodynamic (i.e., in relationship with excess hydrogen) and kinetic (i.e., in relationship with catalysis effect) conditions.

According to another embodiment and as mentioned, the hydrogen-carrier may be an electrically conductive material capable of storing hydrogen. The hydrogen-carrier may include, without limitation, graphite, graphite nanofibers, graphene (i.e., graphene is being used to soak up hydrogen and store it efficiently), fullerene, carbon nano tubes, activated carbon, carbon-metal complexes, zeolites, glass microspheres, any solid nanostructured material capable of adsorbing and/or absorbing hydrogen, either by physical (i.e., van der Waals) or chemical bonding in covalent, polar or ionic form, and the like.

According to another embodiment, the hydrogen-carrier may be an electrically conductive material capable of storing a large amount of hydrogen, which includes, without limitation, functionalized graphite, graphene, fullerene and the like.

According to another embodiment, the hydrogen-carrier may be any mixture of, without limitation, hydrogen-filled graphite, graphene, fullerene, carbon nanotubes, silicon carbide, silicon or carbon-metal complexes, glass microspheres, glass capillaries or filaments, activated carbon and/or functionalized derivatives and the like.

According to another embodiment, the hydrogenation catalyst may be provided in tandem with discriminatory poisons for the hydrogenation of Si-, Ti-, Zr- Hf-, and/or C-centers.

According to another embodiment, for obtaining the solid source, the method may further include the step of compacting the solid polysilane using pressure, either monodirectional and/or isostatical methods.

According to another embodiment, the method may further include the step of compacting the solid polysilane with the hydrogen-carrier and/or the electrically and/or thermally conductive material.

According to another embodiment, the method may further include the step of compacting the solid polysilane with the hydrogen-carrier, the hydrogenation catalyst and/or the electrically and/or thermally conductive material.

According to another embodiment, the temperature of the hydrogenation reaction is in the range of from about 100° C. to about 700° C. and more particularly from about 100° C. to about 400° C.

According to another embodiment, the energy input required for the hydrogenation reaction may be provided by, in conjunction with RF or not, without limitation, thermal resistance, conduction, infrared radiation, UV radiation in the 100-400 nm range, induction heating, microwave radiation, plasma and the like, or any combination of the above, in any proportion.

According to another embodiment, the pressure obtained during the hydrogenation reaction is in the range of from about $10^{-5}$ torr to about 100 atm.

According to another embodiment, the method may further include de step of enriching the solid polysilane with, without limitation, solid, liquid and/or gaseous species which contains N, B, P, Al, Sb, Ga, which includes $NH_3$, $PH_3$, $B_2H_6$, $N_2H_4$, $CH_3$—$NH_2$, hydrazine, ethylenediamine and the like.

The method described above may provide a plurality of improvements, such as, without limitation, an extremely rapid heating, a cost-effective application, a selectively localized heating, and a high reproducibility of the method. These improvements are permitted by the presence of the distributed susceptors in the solid polysilane.

The incorporation of the hydrogenation catalyst (i.e., the component C of the solid polysilane) allows the hydrogenation reaction to occur in a temperature range preventing a large advancement of the Kumada rearrangement leading to carbosilane byproducts.

The presence of a partial pressure molecular hydrogen (hydrogen molecular alone or hydrogen-carrier providing the hydrogen molecular) in the solid polysilane leads thermodynamically the hydrogenation of the nonsaturated Si—Si bonds produced by thermal decomposition in disilane and trisilane compounds (i.e., no thermodynamic data for polymeric species are yet available in the open literature). The thermodynamic predictions for the hydrogenation of the thermally produced $R_3Si$— fragments by reaction with $H_2(g)$ show favorable bond saturation of the thermally fragmented species via terminal —H.

According to a further embodiment, there is provided an apparatus (not shown) for synthesis of silicon-containing precursors for chemical vapor deposition. The apparatus includes a quartz reactor chamber which contains a solid source which includes the solid polysilane mixed with the graphite susceptors (i.e., hydrogen carrier) and/or the hydrogenation catalyst. The apparatus further includes an RF generator which powers a copper inductor surrounding the quartz reactor chamber.

According to another embodiment, the quartz reactor chamber which contains the solid polysilane, intimately mixed with the energy coupling agent, such as a graphite susceptor, and/or the hydrogenation catalyst may replace the steel-made reactor of the prior art, containing only the polysilane source).

The solid sources and methods described above provides an improved heat transfer (i.e., fast, massive, homogeneous), a correction of a chemical imbalance (i.e., more efficient precursor-production, improved compatibility with existent industrial processes, increased application-potential).

The present invention will be more readily understood by referring to the following examples which are given to illustrate the invention rather than to limit its scope.

Example 1

Thermodynamic Equilibrium Calculation for the Hydrogenation of the Thermally Dissociated Si—Si Bond (Generic Example: $Si_2H_6$ (g)+$H_2$ (g)=>2 $SiH_4$(g)

Example 1 shows the effect of initial hydrogen content on the equilibrium concentration of hydrogenated monomer at P=1 atm and T=400° C.

| Initial State | Equilibrium State | | Initial State mole fraction | Equilibrium State mole fraction |
|---|---|---|---|---|
| Pressure (atm) | 1.3158E+00 | SI2H6 | 1.0000E+00 | 5.9201E−10 |
| Temperature (K) | 6.7315E+02 | H2 | 0.0000E+00 | 9.9991E−01 |
| Volume (cm³/g) | 6.7470E+02 | SIH4 | 0.0000E+00 | 8.7478E−05 |
| Enthalpy (erg/g) | 1.9234E+10 | | | |
| Internal Energy (erg/g) | 1.8334E+10 | | | |
| Entropy (erg/g K) | 5.6497E−07 | | | |

-continued

| Initial State | | Equilibrium State | | Initial State mole fraction | Equilibrium State mole fraction |
|---|---|---|---|---|---|
| Pressure (atm) | | 1.3158E+00 | SI2H6 | 8.3333E-01 | 6.7772E-01 |
| Temperature (K) | | 6.7315E+02 | H2 | 1.6667E-01 | 1.1056E-02 |
| Volume (cm$^3$/g) | | 8.0443E+02 | SIH4 | 0.0000E+00 | 3.1122E-01 |
| Enthalpy (erg/g) | | 1.9460E+10 | | | |
| Internal Energy (erg/g) | | 1.8388E+10 | | | |
| Entropy (erg/g K) | | 6.1708E+07 | | | |

| Initial State | | Equilibrium State | | Initial State mole fraction | Equilibrium State mole fraction |
|---|---|---|---|---|---|
| Pressure (atm) | | 1.3158E+00 | SI2H6 | 7.1429E-01 | 4.6848E-01 |
| Temperature (K) | | 6.7315E+02 | H2 | 2.8571E-01 | 3.9908E-02 |
| Volume (cm$^3$/g) | | 9.3250E+02 | SIH4 | 0.0000E+00 | 4.9161E-01 |
| Enthalpy (erg/g) | | 1.9684E+10 | | | |
| Internal Energy (erg/g) | | 1.8440E+10 | | | |
| Entropy (erg/g K) | | 6.6531E+07 | | | |

| Initial State | | Equilibrium State | | Initial State mole fraction | Equilibrium State mole fraction |
|---|---|---|---|---|---|
| Pressure (atm) | | 1.3158E+00 | SI2H6 | 6.2500E-01 | 3.3089E-01 |
| Temperature (K) | | 6.7315E+02 | H2 | 3.7500E-01 | 8.0890E-02 |
| Volume (cm$^3$/g) | | 1.0589E+03 | SIH4 | 0.0000E+00 | 5.8822E-01 |
| Enthalpy (erg/g) | | 1.9904E+10 | | | |
| Internal Energy (erg/g) | | 1.8492E+10 | | | |
| Entropy (erg/g K) | | 7.1193E+07 | | | |

| Initial State | | Equilibrium State | | Initial State mole fraction | Equilibrium State mole fraction |
|---|---|---|---|---|---|
| Pressure (atm) | | 1.3158E+00 | SI2H6 | 5.5556E-01 | 2.3978E-01 |
| Temperature (K) | | 6.7315E+02 | H2 | 4.4444E-01 | 1.2867E-01 |
| Volume (cm$^3$/g) | | 1.1838E+03 | SIH4 | 0.0000E+00 | 6.3154E-01 |
| Enthalpy (erg/g) | | 2.0122E+10 | | | |
| Internal Energy (erg/g) | | 1.8543E+10 | | | |
| Entropy (erg/g K) | | 7.5740E+07 | | | |

| | Initial State | Equilibrium State | | Initial State mole fraction | Initial State mass fraction | Equilibrium State mole fraction | Equilibrium State mass fraction |
|---|---|---|---|---|---|---|---|
| Pressure (atm) | 1.3158E+00 | 1.3157E+00 | SI2H6 | 5.0000E-01 | 9.6862E-01 | 1.7872E-01 | 3.4622E-01 |
| Temperature (K) | 6.7315E+02 | 6.7315E+02 | H2 | 5.0000E-01 | 3.1383E-02 | 1.7872E-01 | 1.1218E-02 |
| Volume (cm$^3$/g) | 1.3071E+03 | 1.3071E+03 | SIH4 | 0.0000E+00 | 0.0000E+00 | 6.4257E-01 | 6.4257E-01 |
| Enthalpy (erg/g) | 2.0337E+10 | 1.8410E+10 | | | | | |
| Internal Energy (erg/g) | 1.8594E+10 | 1.6668E+10 | | | | | |
| Entropy (erg/g K) | 8.0194E+07 | 7.9996E+07 | | | | | |

| | Initial State | Equilibrium State | | Initial State mole fraction | Initial State mass fraction | Equilibrium State mole fraction | Equilibrium State mass fraction |
|---|---|---|---|---|---|---|---|
| Pressure (atm) | 1.3158E+00 | 1.3157E+00 | SI2H6 | 3.3333E-01 | 9.3914E-01 | 5.9224E-02 | 1.6686E-01 |
| Temperature (K) | 6.7315E+02 | 6.7315E+02 | H2 | 6.6667E-01 | 6.0857E-02 | 3.9256E-01 | 3.5835E-02 |
| Volume (cm$^3$/g) | 1.9009E+03 | 1.9009E+03 | SIH4 | 0.0000E+00 | 0.0000E+00 | 5.4822E-01 | 7.9730E-01 |
| Enthalpy (erg/g) | 2.1372E+10 | 1.8982E+10 | | | | | |
| Internal Energy (erg/g) | 1.8838E+10 | 1.6448E+10 | | | | | |
| Entropy (erg/g K) | 1.0137E+08 | 1.0131E+08 | | | | | |

| | Initial State | Equilibrium State | | Initial State mole fraction | Initial State mass fraction | Equilibrium State mole fraction | Equilibrium State mass fraction |
|---|---|---|---|---|---|---|---|
| Pressure (atm) | 1.3158E+00 | 1.3157E+00 | SI2H6 | 2.5000E-01 | 9.1141E-01 | 2.8671E-02 | 1.0453E-01 |
| Temperature (K) | 6.7315E+02 | 6.7315E+02 | H2 | 7.5000E-01 | 8.8590E-02 | 5.2867E-01 | 6.2447E-02 |
| Volume (cm$^3$/g) | 2.4597E+03 | 2.4597E+03 | SIH4 | 0.0000E+00 | 0.0000E+00 | 4.4266E-01 | 8.3303E-01 |
| Enthalpy (erg/g) | 2.2347E+10 | 1.9850E+10 | | | | | |

|  | Initial State | Equilibrium State |  | Initial State | | Equilibrium State | |
|---|---|---|---|---|---|---|---|
| Internal Energy (erg/g) | 1.9067E+10 | 1.6570E+10 | | | | | |
| Entropy (erg/g K) | 1.2106E+08 | 1.2127E+08 | | | | | |

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SI2H6 | 2.0000E−01 | 8.8527E−01 | 1.6831E−02 | 7.4498E−02 |
| Temperature (K) | 6.7315E+02 | 6.7315E+02 | H2 | 8.0000E−01 | 1.1473E−01 | 6.1683E−01 | 8.8463E−02 |
| Volume (cm³/g) | 2.9865E+03 | 2.9865E+03 | SIH4 | 0.0000E+00 | 0.0000E+00 | 3.6634E−01 | 8.3704E−01 |
| Enthalpy (erg/g) | 2.3265E+10 | 2.0756E+10 | | | | | |
| Internal Energy (erg/g) | 1.9284E+10 | 1.6775E+10 | | | | | |
| Entropy (erg/g K) | 1.3953E+08 | 1.3996E+08 | | | | | |

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SI2H6 | 1.6667E−01 | 8.6058E−01 | 1.1056E−02 | 5.7086E−02 |
| Temperature (K) | 6.7315E+02 | 6.7315E+02 | H2 | 8.3333E−01 | 1.3942E−01 | 6.7772E−01 | 1.1338E−01 |
| Volume (cm³/g) | 3.4838E+03 | 3.4838E+03 | SIH4 | 0.0000E+00 | 0.0000E+00 | 3.1122E−01 | 8.2953E−01 |
| Enthalpy (erg/g) | 2.4133E+10 | 2.1646E+10 | | | | | |
| Internal Energy (erg/g) | 1.9488E+10 | 1.7001E+10 | | | | | |
| Entropy (erg/g K) | 1.5690E+08 | 1.5752E+08 | | | | | |

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SI2H6 | 1.4286E−01 | 8.3724E−01 | 7.8145E−03 | 4.5798E−02 |
| Temperature (K) | 6.7315E+02 | 6.7315E+02 | H2 | 8.5714E−01 | 1.6276E−01 | 7.2210E−01 | 1.3712E−01 |
| Volume (cm³/g) | 3.9542E+03 | 3.9542E+03 | SIH4 | 0.0000E+00 | 0.0000E+00 | 2.7009E−01 | 8.1708E−01 |
| Enthalpy (erg/g) | 2.4953E+10 | 2.2504E+10 | | | | | |
| Internal Energy (erg/g) | 1.9681E+10 | 1.7232E+10 | | | | | |
| Entropy (erg/g K) | 1.7330E+08 | 1.7406E+08 | | | | | |

Example 2

Thermodynamic Equilibrium Calculation for the Hydrogenation of the Thermally Dissociated Si—Si Bond Generic Example: $Si_2H_6 (g) + H_2 (g) \Rightarrow 2\, SiH_4(g)$ Example 2 shows the effect of initial hydrogen content on the equilibrium concentration of hydrogenated monomer at P=1 atm and T=300° C.

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 4.0589E+01 | SI2H6 | 1.0000E+00 | 1.0000E+00 | 4.1991E−11 | 1.2954E−09 |
| Temperature (K) | 5.7315E+02 | 5.7315E+02 | H2 | 0.0000E+00 | 0.0000E+00 | 9.9997E−01 | 9.9951E−01 |
| Volume (cm³/g) | 5.7447E+02 | 5.7447E+02 | SIH4 | 0.0000E+00 | 0.0000E+00 | 3.1077E−05 | 4.9489E−04 |
| Enthalpy (erg/g) | 1.7274E+10 | 3.9778E+10 | | | | | |
| Internal Energy (erg/g) | 1.6508E+10 | 1.6151E+10 | | | | | |
| Entropy (erg/g K) | 5.3349E+07 | 5.8929E+08 | | | | | |

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SI2H6 | 8.3333E−01 | 9.9356E−01 | 6.7328E−01 | 8.0274E−01 |
| Temperature (K) | 5.7315E+02 | 5.7315E+02 | H2 | 1.6667E−01 | 6.4383E−03 | 6.6166E−03 | 2.5560E−04 |
| Volume (cm³/g) | 6.8493E+02 | 6.8493E+02 | SIH4 | 0.0000E+00 | 0.0000E+00 | 3.2010E−01 | 1.9701E−01 |
| Enthalpy (erg/g) | 1.7419E+10 | 1.6875E+10 | | | | | |

| | | |
|---|---|---|
| Internal Energy (erg/g) | 1.6506E+10 | 1.5962E+10 |
| Entropy (erg/g K) | 5.8429E+07 | 5.8620E+07 |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 7.1429E-01 | 9.8721E-01 | 4.5442E-01 | 6.2804E-01 |
| Temperature (K) | 5.7315E+02 | 5.7315E+02 | H2 | 2.8571E-01 | 1.2794E-02 | 2.5845E-02 | 1.1573E-03 |
| Volume (cm³/g) | 7.9397E+02 | 7.9397E+02 | SIH4 | 0.0000E+00 | 0.0000E+00 | 5.1974E-01 | 3.7080E-01 |
| Enthalpy (erg/g) | 1.7562E+10 | 1.6539E+10 | | | | | |
| Internal Energy (erg/g) | 1.6504E+10 | 1.5480E+10 | | | | | |
| Entropy (erg/g K) | 6.3123E+07 | 6.3202E+07 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 6.2500E-01 | 9.8093E-01 | 3.0718E-01 | 4.8212E-01 |
| Temperature (K) | 5.7315E+02 | 5.7315E+02 | H2 | 3.7500E-01 | 1.9069E-02 | 5.7184E-02 | 2.9079E-03 |
| Volume (cm³/g) | 9.0163E+02 | 9.0163E+02 | SIH4 | 0.0000E+00 | 0.0000E+00 | 6.3563E-01 | 5.1497E-01 |
| Enthalpy (erg/g) | 1.7704E+10 | 1.6282E+10 | | | | | |
| Internal Energy (erg/g) | 1.6502E+10 | 1.5080E+10 | | | | | |
| Entropy (erg/g K) | 6.7658E+07 | 6.7588E+07 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 5.5556E-01 | 9.7473E-01 | 2.1000E-01 | 3.6845E-01 |
| Temperature (K) | 5.7315E+02 | 5.7315E+02 | H2 | 4.4444E-01 | 2.5265E-02 | 9.8887E-02 | 5.6215E-03 |
| Volume (cm³/g) | 1.0079E+03 | 1.0079E+03 | SIH4 | 0.0000E+00 | 0.0000E+00 | 6.9111E-01 | 6.2593E-01 |
| Enthalpy (erg/g) | 1.7843E+10 | 1.6116E+10 | | | | | |
| Internal Energy (erg/g) | 1.6499E+10 | 1.4772E+10 | | | | | |
| Entropy (erg/g K) | 7.2079E+07 | 7.1898E+07 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 5.0000E-01 | 9.6862E-01 | 1.4715E-01 | 2.8506E-01 |
| Temperature (K) | 5.7315E+02 | 5.7315E+02 | H2 | 5.0000E-01 | 3.1383E-02 | 1.4715E-01 | 9.2360E-03 |
| Volume (cm³/g) | 1.1129E+03 | 1.1129E+03 | SIH4 | 0.0000E+00 | 0.0000E+00 | 7.0571E-01 | 7.0571E-01 |
| Enthalpy (erg/g) | 1.7981E+10 | 1.6033E+10 | | | | | |
| Internal Energy (erg/g) | 1.6497E+10 | 1.4549E+10 | | | | | |
| Entropy (erg/g K) | 7.6409E+07 | 7.6177E+07 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 3.3333E-01 | 9.3914E-01 | 4.0059E-02 | 1.1286E-01 |
| Temperature (K) | 5.7315E+02 | 5.7315E+02 | H2 | 6.6667E-01 | 6.0857E-02 | 3.7339E-01 | 3.4085E-02 |
| Volume (cm³/g) | 1.6185E+03 | 1.6185E+03 | SIH4 | 0.0000E+00 | 0.0000E+00 | 5.8655E-01 | 8.5305E-01 |
| Enthalpy (erg/g) | 1.8644E+10 | 1.6290E+10 | | | | | |
| Internal Energy (erg/g) | 1.6487E+10 | 1.4132E+10 | | | | | |
| Entropy (erg/g K) | 9.6982E+07 | 9.6988E+07 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 2.5000E-01 | 9.1141E-01 | 1.8059E-02 | 6.5837E-02 |
| Temperature (K) | 5.7315E+02 | 5.7315E+02 | H2 | 7.5000E-01 | 8.8590E-02 | 5.1806E-01 | 6.1193E-02 |
| Volume (cm³/g) | 2.0943E+03 | 2.0943E+03 | SIH4 | 0.0000E+00 | 0.0000E+00 | 4.6388E-01 | 8.7297E-01 |
| Enthalpy (erg/g) | 1.9269E+10 | 1.6859E+10 | | | | | |
| Internal Energy (erg/g) | 1.6477E+10 | 1.4067E+10 | | | | | |
| Entropy (erg/g K) | 1.1612E+08 | 1.1647E+08 | | | | | |

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SI2H6 | 2.0000E−01 | 8.8527E−01 | 1.0259E−02 | 4.5412E−02 |
| Temperature (K) | 5.7315E+02 | 5.7315E+02 | H2 | 8.0000E−01 | 1.1473E−01 | 6.1026E−01 | 8.7520E−02 |
| Volume (cm³/g) | 2.5428E+03 | 2.5428E+03 | SIH4 | 0.0000E+00 | 0.0000E+00 | 3.7948E−01 | 8.6707E−01 |
| Enthalpy (erg/g) | 1.9858E+10 | 1.7464E+10 |  |  |  |  |  |
| Internal Energy (erg/g) | 1.6467E+10 | 1.4074E+10 |  |  |  |  |  |
| Entropy (erg/g K) | 1.3405E+08 | 1.3467E+08 |  |  |  |  |  |

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SI2H6 | 1.6667E−01 | 8.6058E−01 | 6.6166E−03 | 3.4165E−02 |
| Temperature (K) | 5.7315E+02 | 5.7315E+02 | H2 | 8.3333E−01 | 1.3942E−01 | 6.7328E−01 | 1.1264E−01 |
| Volume (cm³/g) | 2.9663E+03 | 2.9663E+03 | SIH4 | 0.0000E+00 | 0.0000E+00 | 3.2010E−01 | 8.5320E−01 |
| Enthalpy (erg/g) | 2.0413E+10 | 1.8058E+10 |  |  |  |  |  |
| Internal Energy (erg/g) | 1.6459E+10 | 1.4104E+10 |  |  |  |  |  |
| Entropy (erg/g K) | 1.5093E+08 | 1.5175E+08 |  |  |  |  |  |

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SI2H6 | 1.4286E−01 | 8.3724E−01 | 4.6225E−03 | 2.7091E−02 |
| Temperature (K) | 5.7315E+02 | 5.7315E+02 | H2 | 8.5714E−01 | 1.6276E−01 | 7.1891E−01 | 1.3651E−01 |
| Volume (cm³/g) | 3.3668E+03 | 3.3668E+03 | SIH4 | 0.0000E+00 | 0.0000E+00 | 2.7647E−01 | 8.3640E−01 |
| Enthalpy (erg/g) | 2.0939E+10 | 1.8630E+10 |  |  |  |  |  |
| Internal Energy (erg/g) | 1.6450E+10 | 1.4142E+10 |  |  |  |  |  |
| Entropy (erg/g K) | 1.6685E+08 | 1.6784E+08 |  |  |  |  |  |

Example 3

Thermodynamic Equilibrium Calculation for the Hydrogenation of the Thermally Dissociated Si—Si Bond Generic Example: $Si_2H_6$ (g) + $H_2$ (g) => 2 $SiH_4$(g)

Example 3 shows the effect of initial hydrogen content on the equilibrium concentration of hydrogenated monomer at P=1 atm and 1=200° C.

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 4.0604E+01 | SI2H6 | 1.0000E+00 | 1.0000E+00 | 1.1036E−12 | 3.4056E−11 |
| Temperature (K) | 4.7315E+02 | 4.7315E+02 | H2 | 0.0000E+00 | 0.0000E+00 | 9.9999E−01 | 9.9988E−01 |
| Volume (cm³/g) | 4.7424E+02 | 4.7424E+02 | SIH4 | 0.0000E+00 | 0.0000E+00 | 7.3056E−06 | 1.1638E−04 |
| Enthalpy (erg/g) | 1.5480E+10 | 2.5254E+10 |  |  |  |  |  |
| Internal Energy (erg/g) | 1.4848E+10 | 5.7430E+09 |  |  |  |  |  |
| Entropy (erg/g K) | 4.9914E+07 | 5.6160E+08 |  |  |  |  |  |

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SI2H6 | 8.3333E−01 | 9.9356E−01 | 6.6996E−01 | 7.9878E−01 |
| Temperature (K) | 4.7315E+02 | 4.7315E+02 | H2 | 1.6667E−01 | 6.4383E−03 | 3.2949E−03 | 1.2728E−04 |
| Volume (cm³/g) | 5.6543E+02 | 5.6543E+02 | SIH4 | 0.0000E+00 | 0.0000E+00 | 3.2674E−01 | 2.0109E−01 |
| Enthalpy (erg/g) | 1.5543E+10 | 1.5047E+10 |  |  |  |  |  |
| Internal Energy (erg/g) | 1.4789E+10 | 1.4293E+10 |  |  |  |  |  |
| Entropy (erg/g K) | 5.4837E+07 | 5.5120E+07 |  |  |  |  |  |

-continued

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 7.1429E−01 | 9.8721E−01 | 4.4239E−01 | 6.1142E−01 |
| Temperature (K) | 4.7315E+02 | 4.7315E+02 | H2 | 2.8571E−01 | 1.2794E−02 | 1.3821E−02 | 6.1890E−04 |
| Volume (cm³/g) | 6.5544E+02 | 6.5544E+02 | SIH4 | 0.0000E+00 | 0.0000E+00 | 5.4379E−01 | 3.8796E−01 |
| Enthalpy (erg/g) | 1.5605E+10 | 1.4648E+10 | | | | | |
| Internal Energy (erg/g) | 1.4731E+10 | 1.3774E+10 | | | | | |
| Entropy (erg/g K) | 5.9376E+07 | 5.9582E+07 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 6.2500E−01 | 9.8093E−01 | 2.8390E−01 | 4.4557E−01 |
| Temperature (K) | 4.7315E+02 | 4.7315E+02 | H2 | 3.7500E−01 | 1.9069E−02 | 3.3897E−02 | 1.7237E−03 |
| Volume (cm³/g) | 7.4432E+02 | 7.4432E+02 | SIH4 | 0.0000E+00 | 0.0000E+00 | 6.8221E−01 | 5.5270E−01 |
| Enthalpy (erg/g) | 1.5666E+10 | 1.4302E+10 | | | | | |
| Internal Energy (erg/g) | 1.4674E+10 | 1.3310E+10 | | | | | |
| Entropy (erg/g K) | 6.3757E+07 | 6.3799E+07 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 5.5556E−01 | 9.7473E−01 | 1.7762E−01 | 3.1164E−01 |
| Temperature (K) | 4.7315E+02 | 4.7315E+02 | H2 | 4.4444E−01 | 2.5265E−02 | 6.6509E−02 | 3.7809E−03 |
| Volume (cm³/g) | 8.3207E+02 | 8.3207E+02 | SIH4 | 0.0000E+00 | 0.0000E+00 | 7.5587E−01 | 6.8458E−01 |
| Enthalpy (erg/g) | 1.5727E+10 | 1.4037E+10 | | | | | |
| Internal Energy (erg/g) | 1.4618E+10 | 1.2928E+10 | | | | | |
| Entropy (erg/g K) | 6.8027E+07 | 6.7921E+07 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 5.0000E−01 | 9.6862E−01 | 1.1168E−01 | 2.1634E−01 |
| Temperature (K) | 4.7315E+02 | 4.7315E+02 | H2 | 5.0000E−01 | 3.1383E−02 | 1.1168E−01 | 7.0096E−03 |
| Volume (cm³/g) | 9.1872E+02 | 9.1872E+02 | SIH4 | 0.0000E+00 | 0.0000E+00 | 7.7665E−01 | 7.7665E−01 |
| Enthalpy (erg/g) | 1.5787E+10 | 1.3870E+10 | | | | | |
| Internal Energy (erg/g) | 1.4562E+10 | 1.2645E+10 | | | | | |
| Entropy (erg/g K) | 7.2207E+07 | 7.2036E+07 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 3.3333E−01 | 9.3914E−01 | 2.2464E−02 | 6.3292E−02 |
| Temperature (K) | 4.7315E+02 | 4.7315E+02 | H2 | 6.6667E−01 | 6.0857E−02 | 3.5580E−01 | 3.2479E−02 |
| Volume (cm³/g) | 1.3361E+03 | 1.3361E+03 | SIH4 | 0.0000E+00 | 0.0000E+00 | 6.2174E−01 | 9.0423E−01 |
| Enthalpy (erg/g) | 1.6075E+10 | 1.3843E+10 | | | | | |
| Internal Energy (erg/g) | 1.4293E+10 | 1.2062E+10 | | | | | |
| Entropy (erg/g K) | 9.2060E+07 | 9.2305E+07 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 2.5000E−01 | 9.1141E−01 | 9.3990E−03 | 3.4265E−02 |
| Temperature (K) | 4.7315E+02 | 4.7315E+02 | H2 | 7.5000E−01 | 8.8590E−02 | 5.0940E−01 | 6.0170E−02 |
| Volume (cm³/g) | 1.7289E+03 | 1.7289E+03 | SIH4 | 0.0000E+00 | 0.0000E+00 | 4.8120E−01 | 9.0556E−01 |
| Enthalpy (erg/g) | 1.6346E+10 | 1.4111E+10 | | | | | |
| Internal Energy (erg/g) | 1.4041E+10 | 1.1806E+10 | | | | | |
| Entropy (erg/g K) | 1.1052E+08 | 1.1120E+08 | | | | | |

| | Initial State | Equilibrium State | | Initial State | | Equilibrium State | |
|---|---|---|---|---|---|---|---|
| | | | | mole fraction | mass fraction | mole fraction | mass fraction |
| Pressure (atm) | 1.3158E+00 | 1.3157E+00 | SI2H6 | 2.0000E−01 | 8.8527E−01 | 5.1867E−03 | 2.2958E−02 |
| Temperature (K) | 4.7315E+02 | 4.7315E+02 | H2 | 8.0000E−01 | 1.1473E−01 | 6.0519E−01 | 8.6793E−02 |

-continued

| | Initial State | Equilibrium State | | | | | |
|---|---|---|---|---|---|---|---|
| | | | | mole fraction | mass fraction | mole fraction | mass fraction |
| Volume (cm³/g) | 2.0992E+03 | 2.0992E+03 | SIH4 | 0.0000E+00 | 0.0000E+00 | 3.8963E-01 | 8.9025E-01 |
| Enthalpy (erg/g) | 1.6601E+10 | 1.4404E+10 | | | | | |
| Internal Energy (erg/g) | 1.3803E+10 | 1.1606E+10 | | | | | |
| Entropy (erg/g K) | 1.2781E+08 | 1.2881E+08 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI2H6 | 1.6667E-01 | 8.6058E-01 | 3.2949E-03 | 1.7013E-02 |
| Temperature (K) | 4.7315E+02 | 4.7315E+02 | H2 | 8.3333E-01 | 1.3942E-01 | 6.6996E-01 | 1.1208E-01 |
| Volume (cm³/g) | 2.4488E+03 | 2.4488E+03 | SIH4 | 0.0000E+00 | 0.0000E+00 | 3.2674E-01 | 8.7090E-01 |
| Enthalpy (erg/g) | 1.6843E+10 | 1.4693E+10 | | | | | |
| Internal Energy (erg/g) | 1.3578E+10 | 1.1429E+10 | | | | | |
| Entropy (erg/g K) | 1.4408E+08 | 1.4531E+08 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI2H6 | 1.4286E-01 | 8.3724E-01 | 2.2809E-03 | 1.3368E-02 |
| Temperature (K) | 4.7315E+02 | 4.7315E+02 | H2 | 8.5714E-01 | 1.6276E-01 | 7.1657E-01 | 1.3607E-01 |
| Volume (cm³/g) | 2.7794E+03 | 2.7794E+03 | SIH4 | 0.0000E+00 | 0.0000E+00 | 2.8115E-01 | 8.5057E-01 |
| Enthalpy (erg/g) | 1.7071E+10 | 1.4972E+10 | | | | | |
| Internal Energy (erg/g) | 1.3365E+10 | 1.1267E+10 | | | | | |
| Entropy (erg/g K) | 1.5944E+08 | 1.6083E+08 | | | | | |

Example 4

Thermodynamic Equilibrium Calculation for the Hydrogenation of the Thermally Dissociated Si—Si Bond Generic Example: $Si_3H_8$ (g) + $2H_2$ (g) => 3 $SiH_4$(g)

Example 4 shows the effect of initial hydrogen content on the equilibrium concentration of hydrogenated monomer at P=1 atm and T=200° C.

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 6.0245E+01 | SI3H8 | 1.0000E+00 | 1.0000E+00 | 3.9766E-18 | 1.8208E-16 |
| Temperature (K) | 4.7315E+02 | 4.7315E+02 | H2 | 0.0000E+00 | 0.0000E+00 | 9.9999E-01 | 9.9983E-01 |
| Volume (cm³/g) | 3.1961E+02 | 3.1961E+02 | SIH4 | 0.0000E+00 | 0.0000E+00 | 1.0839E-05 | 1.7266E-04 |
| Enthalpy (erg/g) | 1.5702E+10 | 2.5254E+10 | | | | | |
| Internal Energy (erg/g) | 1.5276E+10 | 5.7434E+09 | | | | | |
| Entropy (erg/g K) | 4.3522E+07 | 5.4530E+08 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 8.3333E-01 | 9.9565E-01 | 7.5375E-01 | 9.0057E-01 |
| Temperature (K) | 4.7315E+02 | 4.7315E+02 | H2 | 1.6667E-01 | 4.3482E-03 | 7.5078E-03 | 1.9587E-04 |
| Volume (cm³/g) | 3.8187E+02 | 3.8187E+02 | SIH4 | 0.0000E+00 | 0.0000E+00 | 2.3874E-01 | 9.9232E-02 |
| Enthalpy (erg/g) | 1.5744E+10 | 1.5467E+10 | | | | | |
| Internal Energy (erg/g) | 1.5235E+10 | 1.4958E+10 | | | | | |
| Entropy (erg/g K) | 4.6875E+07 | 4.6937E+07 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 7.1429E-01 | 9.9134E-01 | 5.8073E-01 | 8.0598E-01 |
| Temperature (K) | 4.7315E+02 | 4.7315E+02 | H2 | 2.8571E-01 | 8.6588E-03 | 1.8597E-02 | 5.6360E-04 |
| Volume (cm³/g) | 4.4358E+02 | 4.4358E+02 | SIH4 | 0.0000E+00 | 0.0000E+00 | 4.0068E-01 | 1.9346E-01 |
| Enthalpy (erg/g) | 1.5785E+10 | 1.5246E+10 | | | | | |

-continued

|  | | |
|---|---|---|
| Internal Energy (erg/g) | 1.5193E+10 | 1.4655E+10 |
| Entropy (erg/g K) | 4.9981E+07 | 5.0003E+07 |

|  |  |  |  | Initial State | | Equilibrium State | |
|---|---|---|---|---|---|---|---|
|  | Initial State | Equilibrium State |  | mole fraction | mass fraction | mole fraction | mass fraction |
| Pressure (atm) | 1.3158E+00 | 1.3157E+00 | SI3H8 | 6.2500E−01 | 9.8707E−01 | 4.5290E−01 | 7.1527E−01 |
| Temperature (K) | 4.7315E+02 | 4.7315E+02 | H2 | 3.7500E−01 | 1.2932E−02 | 3.0803E−02 | 1.0623E−03 |
| Volume (cm³/g) | 5.0477E+02 | 5.0477E+02 | SIH4 | 0.0000E+00 | 0.0000E+00 | 5.1630E−01 | 2.8367E−01 |
| Enthalpy (erg/g) | 1.5826E+10 | 1.5036E+10 | | | | | |
| Internal Energy (erg/g) | 1.5153E+10 | 1.4363E+10 | | | | | |
| Entropy (erg/g K) | 5.2992E+07 | 5.2943E+07 | | | | | |

|  |  |  |  | Initial State | | Equilibrium State | |
|---|---|---|---|---|---|---|---|
|  | Initial State | Equilibrium State |  | mole fraction | mass fraction | mole fraction | mass fraction |
| Pressure (atm) | 1.3158E+00 | 1.3157E+00 | SI3H8 | 5.5556E−01 | 9.8283E−01 | 3.5518E−01 | 6.2835E−01 |
| Temperature (K) | 4.7315E+02 | 4.7315E+02 | H2 | 4.4444E−01 | 1.7169E−02 | 4.3698E−02 | 1.6881E−03 |
| Volume (cm³/g) | 5.6543E+02 | 5.6543E+02 | SIH4 | 0.0000E+00 | 0.0000E+00 | 6.0112E−01 | 3.6996E−01 |
| Enthalpy (erg/g) | 1.5866E+10 | 1.4836E+10 | | | | | |
| Internal Energy (erg/g) | 1.5112E+10 | 1.4083E+10 | | | | | |
| Entropy (erg/g K) | 5.5940E+07 | 5.5803E+07 | | | | | |

|  |  |  |  | Initial State | | Equilibrium State | |
|---|---|---|---|---|---|---|---|
|  | Initial State | Equilibrium State |  | mole fraction | mass fraction | mole fraction | mass fraction |
| Pressure (atm) | 1.3158E+00 | 1.3157E+00 | SI2H6 | 5.0000E−01 | 9.7863E−01 | 2.7864E−01 | 5.4538E−01 |
| Temperature (K) | 4.7315E+02 | 4.7315E+02 | H2 | 5.0000E−01 | 2.1369E−02 | 5.7286E−02 | 2.4483E−03 |
| Volume (cm³/g) | 6.2557E+02 | 6.2557E+02 | SIH4 | 0.0000E+00 | 0.0000E+00 | 6.6407E−01 | 4.5217E−01 |
| Enthalpy (erg/g) | 1.5906E+10 | 1.4648E+10 | | | | | |
| Internal Energy (erg/g) | 1.5072E+10 | 1.3814E+10 | | | | | |
| Entropy (erg/g K) | 5.8838E+07 | 5.8603E+07 | | | | | |

|  |  |  |  | Initial State | | Equilibrium State | |
|---|---|---|---|---|---|---|---|
|  | Initial State | Equilibrium State |  | mole fraction | mass fraction | mole fraction | mass fraction |
| Pressure (atm) | 1.3158E+00 | 1.3157E+00 | SI3H8 | 3.3333E−01 | 9.5816E−01 | 7.2147E−02 | 2.0738E−01 |
| Temperature (K) | 4.7315E+02 | 4.7315E+02 | H2 | 6.6667E−01 | 4.1845E−02 | 1.4429E−01 | 9.0569E−03 |
| Volume (cm³/g) | 9.1872E+02 | 9.1872E+02 | SIH4 | 0.0000E+00 | 0.0000E+00 | 7.8356E−01 | 7.8356E−01 |
| Enthalpy (erg/g) | 1.6102E+10 | 1.3921E+10 | | | | | |
| Internal Energy (erg/g) | 1.4877E+10 | 1.2696E+10 | | | | | |
| Entropy (erg/g K) | 7.2769E+07 | 7.2122E+07 | | | | | |

|  |  |  |  | Initial State | | Equilibrium State | |
|---|---|---|---|---|---|---|---|
|  | Initial State | Equilibrium State |  | mole fraction | mass fraction | mole fraction | mass fraction |
| Pressure (atm) | 1.3158E+00 | 1.3157E+00 | SI3H8 | 2.5000E−01 | 9.3852E−01 | 1.4244E−02 | 5.3473E−02 |
| Temperature (K) | 4.7315E+02 | 4.7315E+02 | H2 | 7.5000E−01 | 6.1481E−02 | 2.7849E−01 | 2.2829E−02 |
| Volume (cm³/g) | 1.1999E+03 | 1.1999E+03 | SIH4 | 0.0000E+00 | 0.0000E+00 | 7.0727E−01 | 9.2370E−01 |
| Enthalpy (erg/g) | 1.6289E+10 | 1.3719E+10 | | | | | |
| Internal Energy (erg/g) | 1.4690E+10 | 1.2119E+10 | | | | | |
| Entropy (erg/g K) | 8.5973E+07 | 8.5474E+07 | | | | | |

|  |  |  |  | Initial State | | Equilibrium State | |
|---|---|---|---|---|---|---|---|
|  | Initial State | Equilibrium State |  | mole fraction | mass fraction | mole fraction | mass fraction |
| Pressure (atm) | 1.3158E+00 | 1.3157E+00 | SI3H8 | 2.0000E−01 | 9.1967E−01 | 3.8297E−03 | 1.7610E−02 |
| Temperature (K) | 4.7315E+02 | 4.7315E+02 | H2 | 8.0000E−01 | 8.0328E−02 | 4.0766E−01 | 4.0933E−02 |
| Volume (cm³/g) | 1.4697E+03 | 1.4697E+03 | SIH4 | 0.0000E+00 | 0.0000E+00 | 5.8851E−01 | 9.4146E−01 |
| Enthalpy (erg/g) | 1.6470E+10 | 1.3849E+10 | | | | | |
| Internal Energy (erg/g) | 1.4510E+10 | 1.1890E+10 | | | | | |
| Entropy (erg/g K) | 9.8575E+07 | 9.8547E+07 | | | | | |

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 1.6667E−01 | 9.0157E−01 | 1.5013E−03 | 8.1212E−03 |
| Temperature (K) | 4.7315E+02 | 4.7315E+02 | H2 | 8.3333E−01 | 9.8433E−02 | 5.0300E−01 | 5.9415E−02 |
| Volume (cm³/g) | 1.7289E+03 | 1.7289E+03 | SIH4 | 0.0000E+00 | 0.0000E+00 | 4.9550E−01 | 9.3246E−01 |
| Enthalpy (erg/g) | 1.6642E+10 | 1.4047E+10 |  |  |  |  |  |
| Internal Energy (erg/g) | 1.4337E+10 | 1.1742E+10 |  |  |  |  |  |
| Entropy (erg/g K) | 1.1064E+08 | 1.1103E+08 |  |  |  |  |  |

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 1.4286E−01 | 8.8416E−01 | 7.3732E−04 | 4.5634E−03 |
| Temperature (K) | 4.7315E+02 | 4.7315E+02 | H2 | 8.5714E−01 | 1.1584E−01 | 5.7290E−01 | 7.7425E−02 |
| Volume (cm³/g) | 1.9781E+03 | 1.9781E+03 | SIH4 | 0.0000E+00 | 0.0000E+00 | 4.2636E−01 | 9.1801E−01 |
| Enthalpy (erg/g) | 1.6809E+10 | 1.4254E+10 |  |  |  |  |  |
| Internal Energy (erg/g) | 1.4171E+10 | 1.1617E+10 |  |  |  |  |  |
| Entropy (erg/g K) | 1.2221E+08 | 1.2293E+08 |  |  |  |  |  |

Example 5

Thermodynamic Equilibrium Calculation for the Hydrogenation of the Thermally Dissociated Si—Si Bond Generic Example: $Si_3H_8 (g) + 2H_2 (g) \Rightarrow 3\, SiH_4(g)$ Example 5 shows the effect of initial hydrogen content on the equilibrium concentration of hydrogenated monomer at P=1 atm and T=300° C.

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 6.0213E+01 | SI3H8 | 1.0000E+00 | 1.0000E+00 | 1.0891E−15 | 4.9843E−14 |
| Temperature (K) | 5.7315E+02 | 5.7315E+02 | H2 | 0.0000E+00 | 0.0000E+00 | 9.9995E−01 | 9.9927E−01 |
| Volume (cm³/g) | 3.8716E+02 | 3.8716E+02 | SIH4 | 0.0000E+00 | 0.0000E+00 | 4.6101E−05 | 7.3397E−04 |
| Enthalpy (erg/g) | 1.7460E+10 | 3.9772E+10 |  |  |  |  |  |
| Internal Energy (erg/g) | 1.6944E+10 | 1.6151E+10 |  |  |  |  |  |
| Entropy (erg/g K) | 4.6887E+07 | 5.7291E+08 |  |  |  |  |  |

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 8.3333E−01 | 9.9565E−01 | 7.5668E−01 | 9.0407E−01 |
| Temperature (K) | 5.7315E+02 | 5.7315E+02 | H2 | 1.6667E−01 | 4.3482E−03 | 1.3365E−02 | 3.4868E−04 |
| Volume (cm³/g) | 4.6258E+02 | 4.6258E+02 | SIH4 | 0.0000E+00 | 0.0000E+00 | 2.2995E−01 | 9.5581E−02 |
| Enthalpy (erg/g) | 1.7557E+10 | 1.7254E+10 |  |  |  |  |  |
| Internal Energy (erg/g) | 1.6940E+10 | 1.6637E+10 |  |  |  |  |  |
| Entropy (erg/g K) | 5.0346E+07 | 5.0356E+07 |  |  |  |  |  |

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 7.1429E−01 | 9.9134E−01 | 5.8755E−01 | 8.1545E−01 |
| Temperature (K) | 5.7315E+02 | 5.7315E+02 | H2 | 2.8571E−01 | 8.6588E−03 | 3.2245E−02 | 9.7720E−04 |
| Volume (cm³/g) | 5.3734E+02 | 5.3734E+02 | SIH4 | 0.0000E+00 | 0.0000E+00 | 3.8020E−01 | 1.8357E−01 |
| Enthalpy (erg/g) | 1.7653E+10 | 1.7071E+10 |  |  |  |  |  |
| Internal Energy (erg/g) | 1.6937E+10 | 1.6354E+10 |  |  |  |  |  |
| Entropy (erg/g K) | 5.3558E+07 | 5.3495E+07 |  |  |  |  |  |

-continued

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 6.2500E−01 | 9.8707E−01 | 4.6359E−01 | 7.3215E−01 |
| Temperature (K) | 5.7315E+02 | 5.7315E+02 | H2 | 3.7500E−01 | 1.2932E−02 | 5.2177E−02 | 1.7994E−03 |
| Volume (cm³/g) | 6.1145E+02 | 6.1145E+02 | SIH4 | 0.0000E+00 | 0.0000E+00 | 4.8424E−01 | 2.6605E−01 |
| Enthalpy (erg/g) | 1.7749E+10 | 1.6904E+10 |  |  |  |  |  |
| Internal Energy (erg/g) | 1.6933E+10 | 1.6089E+10 |  |  |  |  |  |
| Entropy (erg/g K) | 5.6674E+07 | 5.6519E+07 |  |  |  |  |  |

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 5.5556E−01 | 9.8283E−01 | 3.6950E−01 | 6.5368E−01 |
| Temperature (K) | 5.7315E+02 | 5.7315E+02 | H2 | 4.4444E−01 | 1.7169E−02 | 7.2328E−02 | 2.7940E−03 |
| Volume (cm³/g) | 6.8493E+02 | 6.8493E+02 | SIH4 | 0.0000E+00 | 0.0000E+00 | 5.5817E−01 | 3.4353E−01 |
| Enthalpy (erg/g) | 1.7843E+10 | 1.6753E+10 |  |  |  |  |  |
| Internal Energy (erg/g) | 1.6930E+10 | 1.5840E+10 |  |  |  |  |  |
| Entropy (erg/g K) | 5.9726E+07 | 5.9471E+07 |  |  |  |  |  |

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 5.0000E−01 | 9.7863E−01 | 2.9627E−01 | 5.7988E−01 |
| Temperature (K) | 5.7315E+02 | 5.7315E+02 | H2 | 5.0000E−01 | 2.1369E−02 | 9.2547E−02 | 3.9554E−03 |
| Volume (cm³/g) | 7.5778E+02 | 7.5778E+02 | SIH4 | 0.0000E+00 | 0.0000E+00 | 6.1118E−01 | 4.1616E−01 |
| Enthalpy (erg/g) | 1.7937E+10 | 1.6616E+10 |  |  |  |  |  |
| Internal Energy (erg/g) | 1.6927E+10 | 1.5606E+10 |  |  |  |  |  |
| Entropy (erg/g K) | 6.2727E+07 | 6.2371E+07 |  |  |  |  |  |

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 3.3333E−01 | 9.5816E−01 | 9.8883E−02 | 2.8424E−01 |
| Temperature (K) | 5.7315E+02 | 5.7315E+02 | H2 | 6.6667E−01 | 4.1845E−02 | 1.9777E−01 | 1.2413E−02 |
| Volume (cm³/g) | 1.1129E+03 | 1.1129E+03 | SIH4 | 0.0000E+00 | 0.0000E+00 | 7.0335E−01 | 7.0335E−01 |
| Enthalpy (erg/g) | 1.8394E+10 | 1.6162E+10 |  |  |  |  |  |
| Internal Energy (erg/g) | 1.6910E+10 | 1.4679E+10 |  |  |  |  |  |
| Entropy (erg/g K) | 7.1159E+07 | 7.6411E+07 |  |  |  |  |  |

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 2.5000E−01 | 9.3852E−01 | 3.1747E−02 | 1.1918E−01 |
| Temperature (K) | 5.7315E+02 | 5.7315E+02 | H2 | 7.5000E−01 | 6.1481E−02 | 3.1349E−01 | 2.5698E−02 |
| Volume (cm³/g) | 1.4534E+03 | 1.4534E+03 | SIH4 | 0.0000E+00 | 0.0000E+00 | 6.5476E−01 | 8.5512E−01 |
| Enthalpy (erg/g) | 1.8833E+10 | 1.6119E+10 |  |  |  |  |  |
| Internal Energy (erg/g) | 1.6895E+10 | 1.4181E+10 |  |  |  |  |  |
| Entropy (erg/g K) | 9.0845E+07 | 9.0066E+07 |  |  |  |  |  |

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 2.0000E−01 | 9.1967E−01 | 1.1293E−02 | 5.1930E−02 |
| Temperature (K) | 5.7315E+02 | 5.7315E+02 | H2 | 8.0000E−01 | 8.0328E−02 | 4.2259E−01 | 4.2432E−02 |
| Volume (cm³/g) | 1.7803E+03 | 1.7803E+03 | SIH4 | 0.0000E+00 | 0.0000E+00 | 5.6612E−01 | 9.0564E−01 |
| Enthalpy (erg/g) | 1.9254E+10 | 1.6380E+10 |  |  |  |  |  |
| Internal Energy (erg/g) | 1.6880E+10 | 1.4006E+10 |  |  |  |  |  |
| Entropy (erg/g K) | 1.0391E+08 | 1.0339E+08 |  |  |  |  |  |

|  | Initial State | Equilibrium State |  | Initial State | | Equilibrium State | |
| --- | --- | --- | --- | --- | --- | --- | --- |
|  |  |  |  | mole fraction | mass fraction | mole fraction | mass fraction |
| Pressure (atm) | 1.3158E+00 | 1.3157E+00 | SI3H8 | 1.6667E−01 | 9.0157E−01 | 4.8895E−03 | 2.6449E−02 |
| Temperature (K) | 5.7315E+02 | 5.7315E+02 | H2 | 8.3333E−01 | 9.8433E−02 | 5.0978E−01 | 6.0215E−02 |

-continued

| | Initial State | Equilibrium State | | | | | |
|---|---|---|---|---|---|---|---|
| Volume (cm³/g) | 2.0943E+03 | 2.0943E+03 | SIH4 | 0.0000E+00 | 0.0000E+00 | 4.8533E-01 | 9.1334E-01 |
| Enthalpy (erg/g) | 1.9658E+10 | 1.6760E+10 | | | | | |
| Internal Energy (erg/g) | 1.6866E+10 | 1.3967E+10 | | | | | |
| Entropy (erg/g K) | 1.1642E+08 | 1.1622E+08 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 1.4286E-01 | 8.8416E-01 | 2.4976E-03 | 1.5458E-02 |
| Temperature (K) | 5.7315E+02 | 5.7315E+02 | H2 | 8.5714E-01 | 1.1584E-01 | 5.7642E-01 | 7.7901E-02 |
| Volume (cm³/g) | 2.3962E+03 | 2.3962E+03 | SIH4 | 0.0000E+00 | 0.0000E+00 | 4.2108E-01 | 9.0664E-01 |
| Enthalpy (erg/g) | 2.0047E+10 | 1.7169E+10 | | | | | |
| Internal Energy (erg/g) | 1.6852E+10 | 1.3975E+10 | | | | | |
| Entropy (erg/g K) | 1.2841E+08 | 1.2851E+08 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 9.0909E-02 | 8.2078E-01 | 4.1945E-04 | 3.7870E-03 |
| Temperature (K) | 5.7315E+02 | 5.7315E+02 | H2 | 9.0909E-01 | 1.7922E-01 | 7.2811E-01 | 1.4355E-01 |
| Volume (cm³/g) | 3.4955E+03 | 3.4955E+03 | SIH4 | 0.0000E+00 | 0.0000E+00 | 2.7147E-01 | 8.5267E-01 |
| Enthalpy (erg/g) | 2.1462E+10 | 1.8756E+10 | | | | | |
| Internal Energy (erg/g) | 1.6802E+10 | 1.4096E+10 | | | | | |
| Entropy (erg/g K) | 1.7196E+08 | 1.7286E+08 | | | | | |

Example 6

Thermodynamic Equilibrium Calculation for the Hydrogenation of the Thermally Dissociated Si—Si Bond Generic Example: $Si_3H_8\ (g) + 2H_2\ (g) \Rightarrow 3\ SiH_4(g)$ Example 6 shows the effect of initial hydrogen content on the equilibrium concentration of hydrogenated monomer at P=1 atm and T=400° C.

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 8.3333E-01 | 9.9565E-01 | 7.6024E-01 | 9.0832E-01 |
| Temperature (K) | 6.7315E+02 | 6.7315E+02 | H2 | 1.6667E-01 | 4.3482E-03 | 2.0478E-02 | 5.3425E-04 |
| Volume (cm³/g) | 5.4328E+02 | 5.4328E+02 | SIH4 | 0.0000E+00 | 0.0000E+00 | 2.1928E-01 | 9.1146E-02 |
| Enthalpy (erg/g) | 1.9521E+10 | 1.9202E+10 | | | | | |
| Internal Energy (erg/g) | 1.8797E+10 | 1.8478E+10 | | | | | |
| Entropy (erg/g K) | 5.3502E+07 | 5.3487E+07 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 7.1429E-01 | 9.9134E-01 | 5.9542E-01 | 8.2637E-01 |
| Temperature (K) | 6.7315E+02 | 6.7315E+02 | H2 | 2.8571E-01 | 8.6588E-03 | 4.7985E-02 | 1.4542E-03 |
| Volume (cm³/g) | 6.3109E+02 | 6.3109E+02 | SIH4 | 0.0000E+00 | 0.0000E+00 | 3.5659E-01 | 1.7217E-01 |
| Enthalpy (erg/g) | 1.9672E+10 | 1.9070E+10 | | | | | |
| Internal Energy (erg/g) | 1.8830E+10 | 1.8229E+10 | | | | | |
| Entropy (erg/g K) | 5.6801E+07 | 5.6707E+07 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 6.2500E-01 | 9.8707E-01 | 4.7541E-01 | 7.5082E-01 |
| Temperature (K) | 6.7315E+02 | 6.7315E+02 | H2 | 3.7500E-01 | 1.2932E-02 | 7.5816E-02 | 2.6146E-03 |
| Volume (cm³/g) | 7.1813E+02 | 7.1813E+02 | SIH4 | 0.0000E+00 | 0.0000E+00 | 4.4878E-01 | 2.4657E-01 |
| Enthalpy (erg/g) | 1.9821E+10 | 1.8960E+10 | | | | | |

| | | |
|---|---|---|
| Internal Energy (erg/g) | 1.8864E+10 | 1.8002E+10 |
| Entropy (erg/g K) | 6.0005E+07 | 5.9821E+07 |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 5.5556E-01 | 9.8283E-01 | 3.8475E-01 | 6.8065E-01 |
| Temperature (K) | 6.7315E+02 | 6.7315E+02 | H2 | 4.4444E-01 | 1.7169E-02 | 1.0283E-01 | 3.9722E-03 |
| Volume (cm³/g) | 8.0443E+02 | 8.0443E+02 | SIH4 | 0.0000E+00 | 0.0000E+00 | 5.1242E-01 | 3.1537E-01 |
| Enthalpy (erg/g) | 1.9970E+10 | 1.8868E+10 | | | | | |
| Internal Energy (erg/g) | 1.8897E+10 | 1.7795E+10 | | | | | |
| Entropy (erg/g K) | 6.3143E+07 | 6.2868E+07 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 5.0000E-01 | 9.7863E-01 | 3.1441E-01 | 6.1539E-01 |
| Temperature (K) | 6.7315E+02 | 6.7315E+02 | H2 | 5.0000E-01 | 2.1369E-02 | 1.2883E-01 | 5.5059E-03 |
| Volume (cm³/g) | 8.8999E+02 | 8.8999E+02 | SIH4 | 0.0000E+00 | 0.0000E+00 | 5.5676E-01 | 3.7911E-01 |
| Enthalpy (erg/g) | 2.0117E+10 | 1.8792E+10 | | | | | |
| Internal Energy (erg/g) | 1.8930E+10 | 1.7606E+10 | | | | | |
| Entropy (erg/g K) | 6.6229E+07 | 6.5865E+07 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 3.3333E-01 | 9.5816E-01 | 1.2353E-01 | 3.5507E-01 |
| Temperature (K) | 6.7315E+02 | 6.7315E+02 | H2 | 6.6667E-01 | 4.1845E-02 | 2.4705E-01 | 1.5507E-02 |
| Volume (cm³/g) | 1.3071E+03 | 1.3071E+03 | SIH4 | 0.0000E+00 | 0.0000E+00 | 6.2942E-01 | 6.2942E-01 |
| Enthalpy (erg/g) | 2.0833E+10 | 1.8634E+10 | | | | | |
| Internal Energy (erg/g) | 1.9091E+10 | 1.6891E+10 | | | | | |
| Entropy (erg/g K) | 8.1079E+07 | 8.0381E+07 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 2.5000E-01 | 9.3852E-01 | 5.1389E-02 | 1.9292E-01 |
| Temperature (K) | 6.7315E+02 | 6.7315E+02 | H2 | 7.5000E-01 | 6.1481E-02 | 3.5278E-01 | 2.8919E-02 |
| Volume (cm³/g) | 1.7070E+03 | 1.7070E+03 | SIH4 | 0.0000E+00 | 0.0000E+00 | 5.9583E-01 | 7.7816E-01 |
| Enthalpy (erg/g) | 2.1521E+10 | 1.8802E+10 | | | | | |
| Internal Energy (erg/g) | 1.9245E+10 | 1.6526E+10 | | | | | |
| Entropy (erg/g K) | 9.5165E+07 | 9.4375E+07 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 2.0000E-01 | 9.1967E-01 | 2.2847E-02 | 1.0506E-01 |
| Temperature (K) | 6.7315E+02 | 6.7315E+02 | H2 | 8.0000E-01 | 8.0328E-02 | 4.4569E-01 | 4.4752E-02 |
| Volume (cm³/g) | 2.0909E+03 | 2.0909E+03 | SIH4 | 0.0000E+00 | 0.0000E+00 | 5.3146E-01 | 8.5019E-01 |
| Enthalpy (erg/g) | 2.2180E+10 | 1.9210E+10 | | | | | |
| Internal Energy (erg/g) | 1.9393E+10 | 1.6422E+10 | | | | | |
| Entropy (erg/g K) | 1.0861E+08 | 1.0793E+08 | | | | | |

| | | | | Initial State | | Equilibrium State | |
|---|---|---|---|---|---|---|---|
| | Initial State | Equilibrium State | | mole fraction | mass fraction | mole fraction | mass fraction |
| Pressure (atm) | 1.3158E+00 | 1.3157E+00 | SI3H8 | 1.6667E-01 | 9.0157E-01 | 1.1231E-02 | 6.0752E-02 |
| Temperature (K) | 6.7315E+02 | 6.7315E+02 | H2 | 8.3333E-01 | 9.8433E-02 | 5.2246E-01 | 6.1713E-02 |
| Volume (cm³/g) | 2.4597E+03 | 2.4597E+03 | SIH4 | 0.0000E+00 | 0.0000E+00 | 4.6631E-01 | 8.7753E-01 |
| Enthalpy (erg/g) | 2.2814E+10 | 1.9748E+10 | | | | | |
| Internal Energy (erg/g) | 1.9535E+10 | 1.6468E+10 | | | | | |
| Entropy (erg/g K) | 1.2149E+08 | 1.2102E+08 | | | | | |

-continued

|  | Initial State | Equilibrium State |  | Initial State |  | Equilibrium State |  |
|---|---|---|---|---|---|---|---|
|  | Initial State | Equilibrium State |  | mole fraction | mass fraction | mole fraction | mass fraction |
| Pressure (atm) | 1.3158E+00 | 1.3157E+00 | SI3H8 | 1.4286E-01 | 8.8416E-01 | 6.1253E-03 | 3.7910E-02 |
| Temperature (K) | 6.7315E+02 | 6.7315E+02 | H2 | 8.5714E-01 | 1.1584E-01 | 5.8368E-01 | 7.8882E-02 |
| Volume (cm³/g) | 2.8143E+03 | 2.8143E+03 | SIH4 | 0.0000E+00 | 0.0000E+00 | 4.1020E-01 | 8.8321E-01 |
| Enthalpy (erg/g) | 2.3423E+10 | 2.0337E+10 |  |  |  |  |  |
| Internal Energy (erg/g) | 1.9671E+10 | 1.6585E+10 |  |  |  |  |  |
| Entropy (erg/g K) | 1.3384E+08 | 1.3360E+08 |  |  |  |  |  |

|  | Initial State | Equilibrium State |  | Initial State |  | Equilibrium State |  |
|---|---|---|---|---|---|---|---|
|  | Initial State | Equilibrium State |  | mole fraction | mass fraction | mole fraction | mass fraction |
| Pressure (atm) | 1.3158E+00 | 1.3157E+00 | SI3H8 | 1.2500E-01 | 8.6741E-01 | 3.6489E-03 | 2.5321E-02 |
| Temperature (K) | 6.7315E+02 | 6.7315E+02 | H2 | 8.7500E-01 | 1.3259E-01 | 6.3230E-01 | 9.5810E-02 |
| Volume (cm³/g) | 3.1554E+03 | 3.1554E+03 | SIH4 | 0.0000E+00 | 0.0000E+00 | 3.6405E-01 | 8.7887E-01 |
| Enthalpy (erg/g) | 2.4010E+10 | 2.0938E+10 |  |  |  |  |  |
| Internal Energy (erg/g) | 1.9803E+10 | 1.6732E+10 |  |  |  |  |  |
| Entropy (erg/g K) | 1.4571E+08 | 1.4568E+08 |  |  |  |  |  |

|  | Initial State | Equilibrium State |  | Initial State |  | Equilibrium State |  |
|---|---|---|---|---|---|---|---|
|  | Initial State | Equilibrium State |  | mole fraction | mass fraction | mole fraction | mass fraction |
| Pressure (atm) | 1.3158E+00 | 1.3157E+00 | SI3H8 | 9.0909E-02 | 8.2078E-01 | 1.1108E-03 | 1.0029E-02 |
| Temperature (K) | 6.7315E+02 | 6.7315E+02 | H2 | 9.0909E-01 | 1.7922E-01 | 7.2949E-01 | 1.4382E-01 |
| Volume (cm³/g) | 4.1054E+03 | 4.1054E+03 | SIH4 | 0.0000E+00 | 0.0000E+00 | 2.6939E-01 | 8.4615E-01 |
| Enthalpy (erg/g) | 2.5642E+10 | 2.2685E+10 |  |  |  |  |  |
| Internal Energy (erg/g) | 2.0169E+10 | 1.7212E+10 |  |  |  |  |  |
| Entropy (erg/g K) | 1.7868E+08 | 1.7918E+08 |  |  |  |  |  |

Example 7

Thermodynamic Equilibrium Calculation for the Hydrogenation of the Thermally Dissociated Si—Si Bond $$H_3Si\text{—}SiH_2\text{—}CH_3(g) + 2H_2(g) \Rightarrow SiH_4(g) + H_3SiCH_3(g)$$

Example 7 shows the effect of initial hydrogen content on the equilibrium concentration of hydrogenated monomer at P=1 atm and T=400° C.

|  | Initial State | Equilibrium State |  | Initial State |  | Equilibrium State |  |
|---|---|---|---|---|---|---|---|
|  | Initial State | Equilibrium State |  | mole fraction | mass fraction | mole fraction | mass fraction |
| Pressure (atm) | 1.3158E+00 | 3.1589E+01 | SIH3SIH2CH3 | 1.0000E+00 | 1.0000E+00 | 6.6350E-07 | 1.5930E-05 |
| Temperature (K) | 6.7315E+02 | 6.7315E+02 | H2 | 0.0000E+00 | 0.0000E+00 | 9.7370E-01 | 6.1809E-01 |
| Volume (cm³/g) | 5.5058E+02 | 5.5058E+02 | SIH4 | 0.0000E+00 | 0.0000E+00 | 6.4611E-05 | 6.5344E-04 |
| Enthalpy (erg/g) | 9.0048E+09 | 3.3931E+10 | H3SICH3 | 0.0000E+00 | 0.0000E+00 | 2.6238E-02 | 3.8124E-01 |
| Internal Energy (erg/g) | 8.2708E+09 | 1.6308E+10 |  |  |  |  |  |
| Entropy (erg/g K) | 5.8826E+07 | 4.1364E+08 |  |  |  |  |  |

|  | Initial State | Equilibrium State |  | Initial State |  | Equilibrium State |  |
|---|---|---|---|---|---|---|---|
|  | Initial State | Equilibrium State |  | mole fraction | mass fraction | mole fraction | mass fraction |
| Pressure (atm) | 1.3158E+00 | 1.3157E+00 | SIH3SIH2CH3 | 5.0000E-01 | 9.7424E-01 | 1.9085E-01 | 3.7187E-01 |
| Temperature (K) | 6.7315E+02 | 6.7315E+02 | H2 | 5.0000E-01 | 2.5759E-02 | 1.9085E-01 | 9.8320E-03 |
| Volume (cm³/g) | 1.0728E+03 | 1.0728E+03 | SIH4 | 0.0000E+00 | 0.0000E+00 | 3.0915E-01 | 2.5374E-01 |
| Enthalpy (erg/g) | 1.0173E+10 | 8.5820E+09 | H3SICH3 | 0.0000E+00 | 0.0000E+00 | 3.0915E-01 | 3.6456E-01 |
| Internal Energy (erg/g) | 8.7431E+09 | 7.1518E+09 |  |  |  |  |  |
| Entropy (erg/g K) | 7.8216E+07 | 7.7898E+07 |  |  |  |  |  |

|  | Initial State | Equilibrium State | | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SIH3SIH2CH3 | 3.3333E−01 | 9.4978E−01 | 6.7313E−02 | 1.9180E−01 |
| Temperature (K) | 6.7315E+02 | 6.7315E+02 | H2 | 6.6667E−01 | 5.0223E−02 | 4.0065E−01 | 3.0183E−02 |
| Volume (cm³/g) | 1.5688E+03 | 1.5688E+03 | SIH4 | 0.0000E+00 | 0.0000E+00 | 2.6602E−01 | 3.1929E−01 |
| Enthalpy (erg/g) | 1.1283E+10 | 9.2808E+09 | H3SICH3 | 0.0000E+00 | 0.0000E+00 | 2.6602E−01 | 4.5873E−01 |
| Internal Energy (erg/g) | 9.1917E+09 | 7.1893E+09 |  |  |  |  |  |
| Entropy (erg/g K) | 9.5738E+07 | 9.5475E+07 |  |  |  |  |  |

|  | Initial State | Equilibrium State | | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SIH3SIH2CH3 | 2.5000E−01 | 9.2651E−01 | 3.3487E−02 | 1.2410E−01 |
| Temperature (K) | 6.7315E+02 | 6.7315E+02 | H2 | 7.5000E−01 | 7.3490E−02 | 5.3349E−01 | 5.2274E−02 |
| Volume (cm³/g) | 2.0405E+03 | 2.0405E+03 | SIH4 | 0.0000E+00 | 0.0000E+00 | 2.1651E−01 | 3.3800E−01 |
| Enthalpy (erg/g) | 1.2339E+10 | 1.0219E+10 | H3SICH3 | 0.0000E+00 | 0.0000E+00 | 2.1651E−01 | 4.8562E−01 |
| Internal Energy (erg/g) | 9.6184E+09 | 7.4987E+09 |  |  |  |  |  |
| Entropy (erg/g K) | 1.1222E+08 | 1.1213E+08 |  |  |  |  |  |

Example 8

Thermodynamic Equilibrium Calculation for the Hydrogenation of the Thermally Dissociated Si—Si Bond

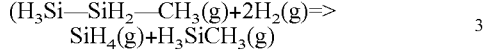

$$(H_3Si-SiH_2-CH_3(g)+2H_2(g) => SiH_4(g)+H_3SiCH_3(g)$$

Example 8 shows the effect of initial hydrogen content on the equilibrium concentration of hydrogenated monomer at P=1 atm and T=300° C.

|  | Initial State | Equilibrium State | | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 2.5773E+01 | SIH3SIH2CH3 | 1.0000E+00 | 1.0000E+00 | 1.6667E−07 | 3.2648E−06 |
| Temperature (K) | 5.7315E+02 | 5.7315E+02 | H2 | 0.0000E+00 | 0.0000E+00 | 9.5747E−01 | 4.9589E−01 |
| Volume (cm³/g) | 4.6879E+02 | 4.6879E+02 | SIH4 | 0.0000E+00 | 0.0000E+00 | 1.8091E−05 | 1.4928E−04 |
| Enthalpy (erg/g) | 6.9314E+09 | 1.8982E+10 | H3SICH3 | 0.0000E+00 | 0.0000E+00 | 4.2510E−02 | 5.0396E−01 |
| Internal Energy (erg/g) | 6.3064E+09 | 6.7398E+09 |  |  |  |  |  |
| Entropy (erg/g K) | 5.5495E+07 | 3.3693E+08 |  |  |  |  |  |

|  | Initial State | Equilibrium State | | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SIH3SIH2CH3 | 5.5556E−01 | 9.7929E−01 | 2.1873E−01 | 3.8557E−01 |
| Temperature (K) | 5.7315E+02 | 5.7315E+02 | H2 | 4.4444E−01 | 2.0714E−02 | 1.0762E−01 | 5.0158E−03 |
| Volume (cm³/g) | 8.2634E+02 | 8.2634E+02 | SIH4 | 0.0000E+00 | 0.0000E+00 | 3.3682E−01 | 2.5010E−01 |
| Enthalpy (erg/g) | 7.6120E+09 | 6.1428E+09 | H3SICH3 | 0.0000E+00 | 0.0000E+00 | 3.3682E−01 | 3.5932E−01 |
| Internal Energy (erg/g) | 6.5103E+09 | 5.0412E+09 |  |  |  |  |  |
| Entropy (erg/g K) | 7.0807E+07 | 7.0450E+07 |  |  |  |  |  |

|  | Initial State | Equilibrium State | | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SIH3SIH2CH3 | 5.0000E−01 | 9.7424E−01 | 1.5648E−01 | 3.0490E−01 |
| Temperature (K) | 5.7315E+02 | 5.7315E+02 | H2 | 5.0000E−01 | 2.5759E−02 | 1.5648E−01 | 8.0614E−03 |
| Volume (cm³/g) | 9.1342E+02 | 9.1342E+02 | SIH4 | 0.0000E+00 | 0.0000E+00 | 3.4352E−01 | 2.8195E−01 |
| Enthalpy (erg/g) | 7.7778E+09 | 6.1215E+09 | H3SICH3 | 0.0000E+00 | 0.0000E+00 | 3.4352E−01 | 4.0509E−01 |
| Internal Energy (erg/g) | 6.5599E+09 | 4.9038E+09 |  |  |  |  |  |
| Entropy (erg/g K) | 7.4367E+07 | 7.3945E+07 |  |  |  |  |  |

-continued

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SIH3SIH2CH3 | 4.5455E−01 | 9.6925E−01 | 1.1553E−01 | 2.4634E−01 |
| Temperature (K) | 5.7315E+02 | 5.7315E+02 | H2 | 5.4545E−01 | 3.0752E−02 | 2.0644E−01 | 1.1639E−02 |
| Volume (cm³/g) | 9.9962E+02 | 9.9962E+02 | SIH4 | 0.0000E+00 | 0.0000E+00 | 3.3902E−01 | 3.0451E−01 |
| Enthalpy (erg/g) | 7.9418E+09 | 6.1530E+09 | H3SICH3 | 0.0000E+00 | 0.0000E+00 | 3.3902E−01 | 4.3751E−01 |
| Internal Energy (erg/g) | 6.6091E+09 | 4.8204E+09 |  |  |  |  |  |
| Entropy (erg/g K) | 7.7869E+07 | 7.7428E+07 |  |  |  |  |  |

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SIH3SIH2CH3 | 3.3333E−01 | 9.4978E−01 | 4.5146E−02 | 1.2940E−01 |
| Temperature (K) | 5.7315E+02 | 5.7315E+02 | H2 | 6.6667E−01 | 5.0223E−02 | 3.7875E−01 | 2.8533E−02 |
| Volume (cm³/g) | 1.3357E+03 | 1.3357E+03 | SIH4 | 0.0000+00 | 0.0000+00 | 2.8792E−01 | 3.4557E−01 |
| Enthalpy (erg/g) | 8.5816E+09 | 6.5517E+09 | H3SICH3 | 0.0000+00 | 0.0000+00 | 2.8792E−01 | 4.9649E−01 |
| Internal Energy (erg/g) | 6.8008E+09 | 1.7709E+09 |  |  |  |  |  |
| Entropy (erg/g K) | 9.1397E+07 | 9.1090E+07 |  |  |  |  |  |

|  | Initial State | Equilibrium State |  | Initial State | | Equilibrium State | |
|---|---|---|---|---|---|---|---|
|  |  |  |  | mole fraction | mass fraction | mole fraction | mass fraction |
| Pressure (atm) | 1.3158E+00 | 1.3157E+00 | SIH3SIH2CH3 | 2.5000E−01 | 9.2651E−01 | 2.0907E−02 | 7.7481E−02 |
| Temperature (K) | 5.7315E+02 | 5.7315E+02 | H2 | 7.5000E−01 | 7.3490E−02 | 5.2091E−01 | 5.1042E−02 |
| Volume (cm³/g) | 1.7373E+03 | 1.7673E+03 | SIH4 | 0.0000E+00 | 0.0000E+00 | 2.2909E−01 | 3.5764E−01 |
| Enthalpy (erg/g) | 9.3461E+09 | 7.2452E+09 | H3SICH3 | 0.0000E+00 | 0.0000E+00 | 2.2909E−01 | 5.1384E−01 |
| Internal Energy (erg/g) | 7.0298E+09 | 4.9291e+09 |  |  |  |  |  |
| Entropy (erg/g K) | 1.0741E+08 | 1.0735E+08 |  |  |  |  |  |

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A solid source for synthesis of silicon-containing precursors for chemical vapor deposition, the solid source comprising:
   a solid polysilane;
   an energy coupling agent distributed in the solid polysilane; and
   hydrogen, mixed with the solid polysilane and the energy coupling agent distributed in the solid polysilane, in a necessary amount to satisfy a hydrogen deficiency during a hydrogenolysis reaction.

2. The solid source of claim 1, further comprising a hydrogen-carrier mixed with the solid polysilane and the energy coupling agent distributed in the solid polysilane, the hydrogen-carrier comprising the hydrogen in the necessary amount to satisfy the hydrogen deficiency during the hydrogenolysis reaction.

3. The solid source of claim 2, further comprising a hydrogenation catalyst mixed with at least one of the solid polysilane, the energy coupling agent and the hydrogen-carrier.

4. The solid source of claim 2, wherein at least one of the hydrogen-carrier and the energy coupling agent comprises at least one of: a graphite material, a fullerene material, a graphene material, an activated carbon material, a carbon-metal complex material, metal complex material, ceramic material, a zeolite material, a glass microsphere material, a glass capillary or filament material, a silicon carbide material, a silicon-metal complex material, an electrically conductive material that can be heated by at least one of: induction, radio-frequency, absorption radiation and microwave radiation and a nanotube material.

5. The solid source of claim 3, wherein the hydrogenation catalyst comprises at least one of: cobalt (Co), nickel (Ni), platinum (Pt), palladium (Pd), rhodium (Rh), ruthenium (Ru), titanium (Ti), zirconium (Zr), hafnium (Hf), an oxide of a Ziegler-Nata catalyst and a metal-free catalyst.

6. The solid source of claim 2, wherein the hydrogen contained in the hydrogen-carrier is from about 0.01 to about 10 times a stoichiometric amount necessary to satisfy the hydrogenolysis reaction.

7. The solid source of claim 6, wherein the solid polysilane and the hydrogen are mixed in a stoichiometric ratio solid polysilane/hydrogen of about 0.1 to about 10.

8. The solid source of claim 2, wherein the hydrogen-carrier is in one of: a gel state and a solid state.

9. The solid source of claim 1, further comprising at least one of: an electrically conductive material and a thermally conductive material mixed with the solid polysilane.

10. The solid source of claim 9, wherein the at least one of: the electrically conductive material and the thermally conductive material comprises at least one of: a powder capable of RF coupling, flakes capable of RF coupling, granules capable of RF coupling, chunks capable of RF coupling, a powder capable of IR coupling, flakes capable of IR coupling, granules capable of IR coupling, chunks capable of IR coupling, a powder capable of UV coupling, flakes capable of UV coupling, granules capable of UV coupling and chunks capable of UV coupling.

11. The solid source of claim 1, wherein the weight of the solid source is between about 0.1 g to about 10 kg.

12. The solid source of claim 1, wherein the solid polysilane comprises at least one of: a polymethylsilane, a polydimethylsilane, a polyvinylsilane, a polyhydridosilane and a polyphenylsilane.

13. A method for synthesis of a solid source for the production of silicon-containing precursors for vapor chemical deposition, the method comprising:
   mixing a solid polysilane and an energy coupling agent distributed in the solid polysilane with a necessary amount of hydrogen to satisfy a hydrogen deficiency during a hydrogenolysis reaction.

14. The method of claim 13, wherein mixing the solid polysilane and the energy coupling agent distributed in the solid polysilane with a necessary amount of hydrogen to satisfy the hydrogen deficiency during the hydrogenolysis reaction comprises mixing the solid polysilane and the energy coupling agent distributed in the solid polysilane with a hydrogen-carrier comprising the necessary amount of hydrogen to satisfy the hydrogen deficiency during the hydrogenolysis reaction.

15. The method of claim 14, further comprising mixing a hydrogenation catalyst with at least one of: the solid polysilane, the energy coupling agent and the hydrogen-carrier, the hydrogenation catalyst comprising at least one of: cobalt (Co), nickel (Ni), platinum (Pt), palladium (Pd), rhodium (Rh), ruthenium (Ru), titanium (Ti), zirconium (Zr), hafnium (Hf), an oxide of a Ziegler-Nata catalyst and a metal-free catalyst.

16. The method of claim 14, wherein the mixing the solid polysilane and the energy coupling agent distributed in the solid polysilane with the hydrogen-carrier comprises one of: pressing and compacting the solid polysilane and the energy coupling agent distributed in the solid polysilane with the hydrogen-carrier.

17. The method of claim 16, wherein the one of: pressing and compacting occurs at a pressure of between about $10^{-5}$ torr and 100 atm.

18. The method of claim 13, wherein the hydrogenolysis reaction has a reaction temperature of between about 100° C. and about 400° C.

19. The method of claim 18, further comprising controlling the reaction temperature of the hydrogenolysis reaction for sequentially satisfy the hydrogen deficiency during the hydrogenolysis reaction.

20. The method of claim 13, further comprising mixing at least one of: an electrically conductive material and a thermally conductive material with at least one of: the solid polysilane, the energy coupling agent and the hydrogen.

21. The method of claim 20, further comprising mixing the electrically conductive material and the thermally conductive material with the at least one of: the solid polysilane, the energy coupling agent and the hydrogen.

* * * * *